(12) United States Patent
Oh

(10) Patent No.: US 9,029,828 B2
(45) Date of Patent: May 12, 2015

(54) PHASE-CHANGE MEMORY DEVICES INCLUDING THERMALLY-ISOLATED PHASE-CHANGE LAYERS AND METHODS OF FABRICATING THE SAME

(71) Applicant: Samsung Electronics Co., Ltd., Suwon-si (KR)

(72) Inventor: Gyuhwan Oh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/067,228

(22) Filed: Oct. 30, 2013

(65) Prior Publication Data

US 2014/0124726 A1 May 8, 2014

(30) Foreign Application Priority Data

Nov. 8, 2012 (KR) .......................... 10-2012-0125824

(51) Int. Cl.
*H01L 45/00* (2006.01)
*H01L 27/24* (2006.01)

(52) U.S. Cl.
CPC ............ *H01L 45/1293* (2013.01); *H01L 45/06* (2013.01); *H01L 45/1233* (2013.01); *H01L 45/126* (2013.01); *H01L 45/143* (2013.01); *H01L 45/144* (2013.01); *H01L 45/1683* (2013.01); *H01L 27/2409* (2013.01); *H01L 27/2463* (2013.01)

(58) Field of Classification Search
CPC .................................................. H01L 45/1253
USPC .............................................................. 257/4
See application file for complete search history.

(56) References Cited

U.S. PATENT DOCUMENTS

| | | | |
|---|---|---|---|
| 5,687,112 A * | 11/1997 | Ovshinsky | ..................... 365/163 |
| 6,087,674 A * | 7/2000 | Ovshinsky et al. | ............... 257/2 |
| 6,815,704 B1 | 11/2004 | Chen | |
| 7,687,307 B2 | 3/2010 | Lung | |
| 7,733,691 B2 * | 6/2010 | Kim et al. | ..................... 365/163 |
| 7,763,492 B2 | 7/2010 | Chen | |
| 7,763,878 B2 | 7/2010 | Horii et al. | |
| 7,816,661 B2 | 10/2010 | Lai et al. | |
| 7,842,999 B2 | 11/2010 | Takaishi | |
| 7,977,662 B2 | 7/2011 | Ryoo et al. | |
| 8,026,503 B2 | 9/2011 | Tu | |

(Continued)

FOREIGN PATENT DOCUMENTS

| | | |
|---|---|---|
| KR | 10-0437457 | 6/2004 |
| KR | 10-0615583 | 8/2006 |

(Continued)

*Primary Examiner* — Caleb Henry
(74) *Attorney, Agent, or Firm* — Myers Bigel Sibley & Sajovec, PA

(57) ABSTRACT

Provided are a phase-change memory device and a method of fabricating the same. The device may include memory cells provided at intersections of word lines and bit lines that extend along first and second directions crossing each other, and a mold layer including thermal insulating regions, such as air gaps, that may be provided between the memory cells to separate the memory cells from each other. Each of the memory cells may include a lower electrode electrically connected to the word line to have a first width in the first direction, an upper electrode electrically connected to the bit line to have a second width greater than the first width in the first direction, and a phase-change layer provided between the lower and upper electrodes to have the first width in the first direction.

17 Claims, 30 Drawing Sheets

(56) References Cited

U.S. PATENT DOCUMENTS

| | | | |
|---|---|---|---|
| 8,097,487 B2 | 1/2012 | Lung | |
| 8,106,376 B2 | 1/2012 | Lai et al. | |
| 8,110,430 B2 | 2/2012 | Lung | |
| 8,129,705 B2* | 3/2012 | Kinoshita et al. | 257/2 |
| 8,288,750 B2 | 10/2012 | Shen et al. | |
| 8,338,225 B2* | 12/2012 | Breitwisch et al. | 438/102 |
| 8,501,559 B2* | 8/2013 | Tang et al. | 438/238 |
| 2006/0035429 A1 | 2/2006 | Cho | |
| 2007/0063180 A1* | 3/2007 | Asano et al. | 257/3 |
| 2008/0165574 A1* | 7/2008 | Kim et al. | 365/163 |
| 2008/0237566 A1* | 10/2008 | An et al. | 257/4 |
| 2009/0230378 A1* | 9/2009 | Ryoo et al. | 257/4 |
| 2010/0034016 A1* | 2/2010 | Liu | 365/163 |
| 2010/0264395 A1* | 10/2010 | Liu | 257/2 |
| 2010/0270527 A1 | 10/2010 | Sawamura | |
| 2011/0006279 A1 | 1/2011 | Chen | |
| 2012/0074370 A1* | 3/2012 | Liu | 257/2 |
| 2013/0017663 A1* | 1/2013 | Park et al. | 438/382 |
| 2013/0178048 A1* | 7/2013 | Sun et al. | 438/478 |
| 2014/0252294 A1* | 9/2014 | BrightSky et al. | 257/2 |

FOREIGN PATENT DOCUMENTS

| | | |
|---|---|---|
| KR | 10-2008-0072296 | 8/2008 |
| KR | 10-0861296 | 9/2008 |

* cited by examiner

PHASE-CHANGE MEMORY DEVICES INCLUDING THERMALLY-ISOLATED PHASE-CHANGE LAYERS AND METHODS OF FABRICATING THE SAME

CROSS-REFERENCE TO RELATED APPLICATIONS

This U.S. non-provisional patent application claims priority under 35 U.S.C. §119 to Korean Patent Application No. 10-2012-0125824, filed on Nov. 8, 2012, in the Korean Intellectual Property Office, the entire contents of which are hereby incorporated by reference.

FIELD

Embodiments of the inventive concept relate to a semiconductor memory device, and in particular, to phase-change memory devices and methods of fabricating the same.

BACKGROUND

A phase-change memory (PRAM) is one of next-generation nonvolatile memory devices that are expected to meet an increasing demand for a high-performance and low-power semiconductor memory device. In PRAM devices, data may be stored or erased by heating or cooling a phase-change layer therein. However, there may be thermal interference between adjacent memory cells.

SUMMARY

Some embodiments of the inventive concept provide a phase-change memory device capable of reducing thermal interference and a method of fabricating the same.

Other embodiments of the inventive concept provide a phase-change memory device capable of reducing a reset current and a method of fabricating the same.

Still other embodiments of the inventive concept provide a phase-change memory device including a thermal insulating region, such as an air gap, between memory cells and a method of fabricating the same.

Some embodiments of the inventive concept provide a method of fabricating a phase-change memory device with a simplified process.

In further embodiments of the inventive concept, a thermal insulating region may be provided between phase-change layers.

In other embodiments of the inventive concept, a size of the thermal insulating region may be controlled by adjusting a deposition condition of a mold layer.

In still other embodiments of the inventive concept, a lower electrode may be formed to have a dash shape with a shortened longitudinal axis.

In some embodiments of the inventive concept, a phase-change memory cell may be formed to have a confined structure.

In yet other embodiments of the inventive concept, it is possible to skip photo and/or etching processes for defining a space to be provided with an upper electrode and a phase-change layer.

According to some embodiments of the inventive concepts, a method of fabricating a phase-change memory device may include forming memory cells at intersections of word lines and bit lines, each of the memory cells including a lower electrode, a phase-change layer, and an upper electrode that may be vertically aligned with each other, and the word lines and the bit lines extending along first and second directions crossing each other. The forming of the memory cell may include forming a lower electrode layer on a substrate to include portions that extend along the first direction and may be separated from each other in the second direction, forming a mask layer on the lower electrode layer to extend the second direction, patterning the lower electrode layer using the mask layer as an etch mask to form the lower electrodes separated from each other in both of the first and second directions, and etching a sidewall of the lower electrode to shrink the lower electrode in the first direction.

In some embodiments, the forming of the memory cell may further include forming a first mold layer on the substrate to define a first trench extending along the first direction, forming a conductive layer on the substrate to cover the first mold layer, and patterning the conductive layer to form the lower electrode layer on an inner wall of the first trench.

In further embodiments, the forming of the memory cell may further include forming a second mold layer on the substrate to cover the shrunk lower electrode, to expose a top surface of the mask layer, and to have a thermal insulating region between the shrunk lower electrodes, removing the mask layer to form a second trench exposing the shrunk lower electrode and extending along the second direction, and recessing the shrunk lower electrode exposed by the second trench.

In some embodiments, the forming of the memory cell may further include recessing the shrunk lower electrode to form a plug hole exposing the recessed lower electrode below the second trench, forming the phase-change layer in the plug hole to be self-aligned with the recessed lower electrode, and forming the upper electrode in the second trench to be self-aligned with the phase-change layer. The phase-change layers may be spaced apart from each other, in the first direction, by the thermal insulating region.

In some embodiments, the forming of the memory cell may further include forming a protection layer surrounding the shrunk lower electrode and the mask layer, before the forming of the second mold layer, and the protection layer may be formed by a deposition process providing step coverage better than that of the second mold layer.

In some embodiments, the protection layer may be formed using a thermal deposition process and the second mold layer may be formed using a plasma-using process.

In further embodiments, the method may further include forming a first interlayered insulating layer on the substrate, forming a selection device electrically connected to the word line through the first interlayered insulating layer, forming the memory cell electrically connected to the selection device, on the first interlayered insulating layer, forming a second interlayered insulating layer on the memory cell, and forming a contact connecting the memory cell electrically to the bit line, through the second interlayered insulating layer.

According to other embodiments of the inventive concepts, a method of fabricating a phase-change memory device may include forming memory cells at intersections of word lines and bit lines, each of the memory cells including a lower electrode, a phase-change layer, and an upper electrode that may be vertically aligned with each other, and the word lines and the bit lines extending along first and second directions crossing each other. The forming of the memory cell may include forming a lower electrode layer extending along the first direction on a substrate and separated from each other in the second direction; forming a mask layer on the lower electrode layer to extend along the second direction and be separated from each other in the first direction; patterning the lower electrode layer using the mask layer as an etch mask to form the lower electrode separated from each other in both of the first and second directions and have a width smaller than that of the mask layer; and filling a first space between the lower electrodes and a second space between the mask layers with an insulating material to form a mold layer. The first space is larger than the second space. Before the first space is filled with the insulating material, the second space may be filled with the insulating material, thereby defining a thermal insulating region between the memory cells.

In some embodiments, the forming of the memory cell may further include depositing an insulating material to have a step coverage better than that of the mold layer, before the formation of the mold layer to form a protection layer surrounding the lower electrode and the mask layer.

In other embodiments, the forming of the memory cell may include planarizing the mold layer to expose the mask layer; removing the mask layer to form a trench exposing the lower electrode and extending along the second direction, in the mold layer; recessing the lower electrode exposed by the trench to form a plug hole exposing the recessed lower electrode below the trench; filling the plug hole with a phase-change material to form the phase-change layer that is self-aligned with the recessed lower electrode and spaced apart from each other in both of the first and second directions; and filling the trench with a conductive material to form the upper electrode that is self-aligned with the phase-change layer and extends along the second direction.

In further embodiments, the forming of the mask layer may include depositing a conductive or insulating material having an etch selectivity with respect to the mold layer, on the lower electrode layer.

In some embodiments, the forming of the lower electrode may include performing a first etching using the mask layer to separate the lower electrode layer along both of the first and second directions and performing a second etching using the mask layer to recess partially a sidewall of the separated lower electrode layer along the first direction.

According to still other embodiments of the inventive concepts, a method of fabricating a phase-change memory device may include forming memory cells at intersections of word lines and bit lines, each of the memory cells including a lower electrode, a phase-change layer, and an upper electrode that may be vertically aligned with each other, and the word lines and the bit lines extending along first and second directions crossing each other. The forming of the memory cell may include forming a lower electrode layer extending along the first direction on a substrate and separated from each other in the second direction; forming a mask layer on the lower electrode layer to extend along the second direction and be separated from each other in the first direction; patterning the lower electrode layer using the mask layer as an etch mask to form the lower electrode separated from each other in both of the first and second directions; forming a mold layer on the substrate to cover the lower electrode and expose a top surface of the mask layer; removing the mask layer to form a trench providing a space for the upper electrode in the second mold layer; and recessing the lower electrode exposed by the trench to form a plug hole providing a space for the phase-change layer.

In some embodiments, the forming of the phase-change layer may include forming a phase-change material layer on the substrate to fill the plug hole and the trench, and then, removing the phase-change material layer from the trench to form the phase-change layer, which may fill locally the plug hole and be self-aligned with the recessed lower electrode, and include a plurality of patterns separated along both of the first and second directions.

In further embodiments, the forming of the upper electrode may include forming a conductive layer on the substrate to fill the trench, and planarizing the conductive layer to form the upper electrode filling the trench and extend along the second direction. The upper electrode may be self-aligned with the phase-change layer.

In other embodiments, the forming of the mold layer may include depositing an insulating material, which is formed to fill spaces between the lower electrodes and between the mask layers and have an etch selectivity with respect to the mask layer, and planarizing the insulating material to expose a top surface of the mask layer.

In some embodiments, the forming of the memory cell may further include depositing the insulating material having an etch selectivity with respect to the mask layer to form a protection layer surrounding the lower electrode and the mask layer, before the formation of the mold layer. The protection layer may be formed to have a step coverage better than that of the mold layer.

In some embodiments, the forming of the memory cell may further include partially removing a sidewall of the lower electrode through a wet etching using the mask layer to shrink the lower electrode along the first direction.

In other embodiments, the forming of the mold layer may further include forming a thermal insulating region between the shrunk lower electrodes. The formation of the thermal insulating region may include filling a space between the mask layers with the insulating material having an etch selectivity with respect to the mask layer, before a space between the shrunk lower electrodes is filled with the insulating material. The phase-change layers may be spaced apart from each other by the thermal insulating region.

In some embodiments, the forming of the thermal insulating region may be formed depositing the insulating material with a first step coverage to form a first thermal insulating region with a first size, or depositing the insulating material with a second step coverage, which is worse than the first step coverage, to form a second thermal insulating region with a second size that is greater than the first size.

According to some embodiments of the inventive concepts, a phase-change memory device may include memory cells at intersections of word lines and bit lines that extend along first and second directions crossing each other, and a mold layer including thermal insulating regions that may be provided between the memory cells to separate the memory cells from each other. Each of the memory cells may include a lower electrode electrically connected to the word line to have a first width in the first direction, an upper electrode electrically connected to the bit line to have a second width in the first direction, the second width being greater than the first width, and a phase-change layer provided between the lower electrode and the upper electrode to have the first width in the first direction.

In other embodiments, the lower electrode may be confined in the intersection, the phase-change layer may be vertically aligned with the lower electrode and may be confined in the intersection, and the upper electrode may be vertically aligned with the phase-change layer and extend along the second direction.

In further embodiments, the thermal insulating region may be provided between the phase-change layers that may be spaced apart from each other in the first direction.

In some embodiments, the thermal insulating region extends between the lower electrodes that may be spaced apart from each other in the first direction.

In other embodiments, a first space between the upper electrodes adjacent to each other may be greater than at least one of a second space between the phase-change layers and a third space between the lower electrodes adjacent to each other.

In some embodiments, the thermal insulating region may be provided in at least one of the second space and the third space.

In further embodiments, the memory cell may further include a protection layer provided between the memory cell and the mold layer to cover both sidewalls of the memory cell and extend along the second direction.

In some embodiments, the device may further include a selection device provided between the memory cell and the word line. The selection device may include a diode provided within the intersection.

In further embodiments, the device may further include an upper electrode contact provided between the bit line and the upper electrode. The upper electrode contact extends along the second direction.

According to other embodiments of the inventive concepts, a phase-change memory device may include word lines and bit lines crossing each other and variable resistors and selection devices provided at intersections between the word lines and the bit lines. The variable resistor may include a pillar shaped memory portion electrically connected to the selection device to have a first width and a line shaped connecting portion provided on the memory portion and electrically connected to the bit line. The connecting portion has a second width that is greater than the first width.

In some embodiments, the memory portion may include a lower electrode electrically connected to the selection device and confined within the intersection, and a phase-change layer provided on the lower electrode and confined within the intersection.

In further embodiments, the device may further include a first interlayered insulating layer provided between the variable resistor and the word line. The selection device may be provided in the first interlayered insulating layer provided. For example, the selection device may include a diode protruding the first interlayered insulating layer.

In some embodiments, the connecting portion may include an upper electrode provided on the phase-change layer to extend parallel to the bit line.

In other embodiments, the device may further include a second interlayered insulating layer provided between the variable resistor and the bit line and an upper electrode contact penetrating the second interlayered insulating layer to connect the upper electrode electrically to the bit line. The upper electrode contact may extend parallel to an extending direction of the upper electrode.

In further embodiments, the device may further include a mold layer provided between the variable resistors to separate the variable resistors electrically from each other. The mold layer may define thermal insulating regions formed between the memory portions.

In some embodiments, the variable resistor may further include a protection layer extending parallel to the bit line and covering both sidewalls of the variable resistor.

BRIEF DESCRIPTION OF THE DRAWINGS

Various embodiments will be more clearly understood from the following brief description taken in conjunction with the accompanying drawings. The accompanying drawings represent non-limiting, example embodiments as described herein.

Figure 1A:
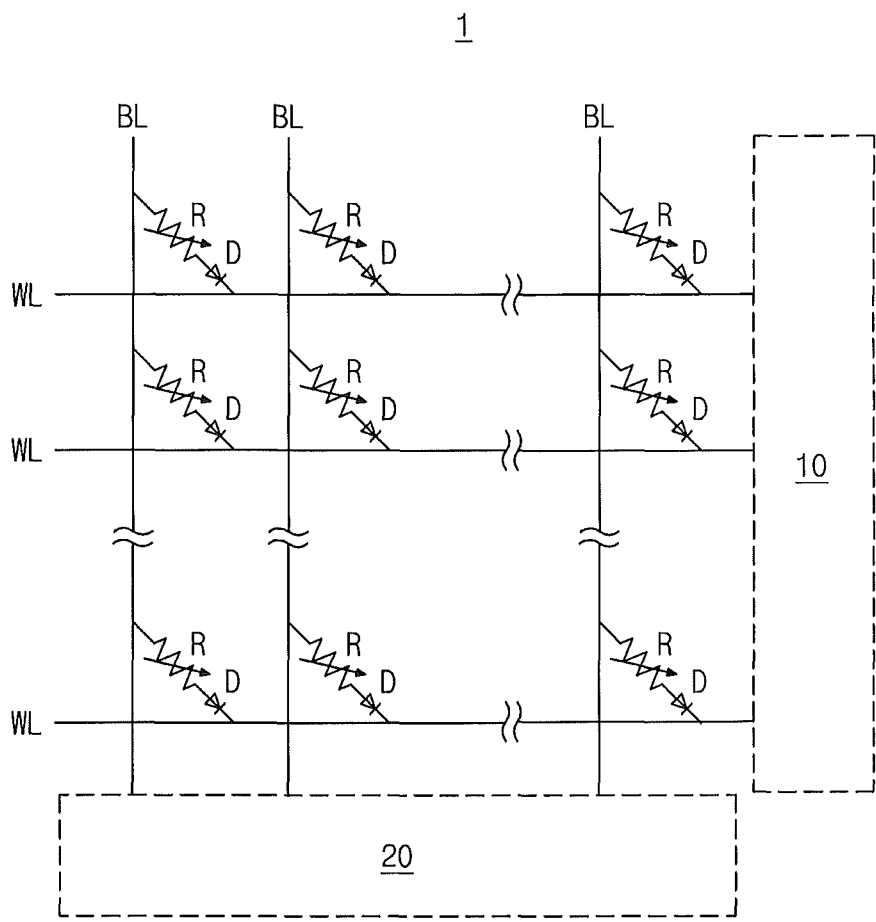
FIG. 1A is an equivalent circuit diagram of a phase-change memory device according to some embodiments of the inventive concept.

It should be noted that these figures are intended to illustrate the general characteristics of methods, structure and/or materials utilized in certain embodiments and to supplement the written description provided below. These drawings are not, however, to scale and may not precisely reflect the precise structural or performance characteristics of any given embodiment, and should not be interpreted as defining or limiting the range of values or properties encompassed by embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Various embodiments of the inventive concepts will now be described more fully with reference to the accompanying drawings, in which embodiments are shown. Some embodiments of the inventive concepts may, however, be embodied in many different forms and should not be construed as being limited to the embodiments set forth herein; rather, these embodiments are provided so that this disclosure will be thorough and complete, and will fully convey the concept of embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
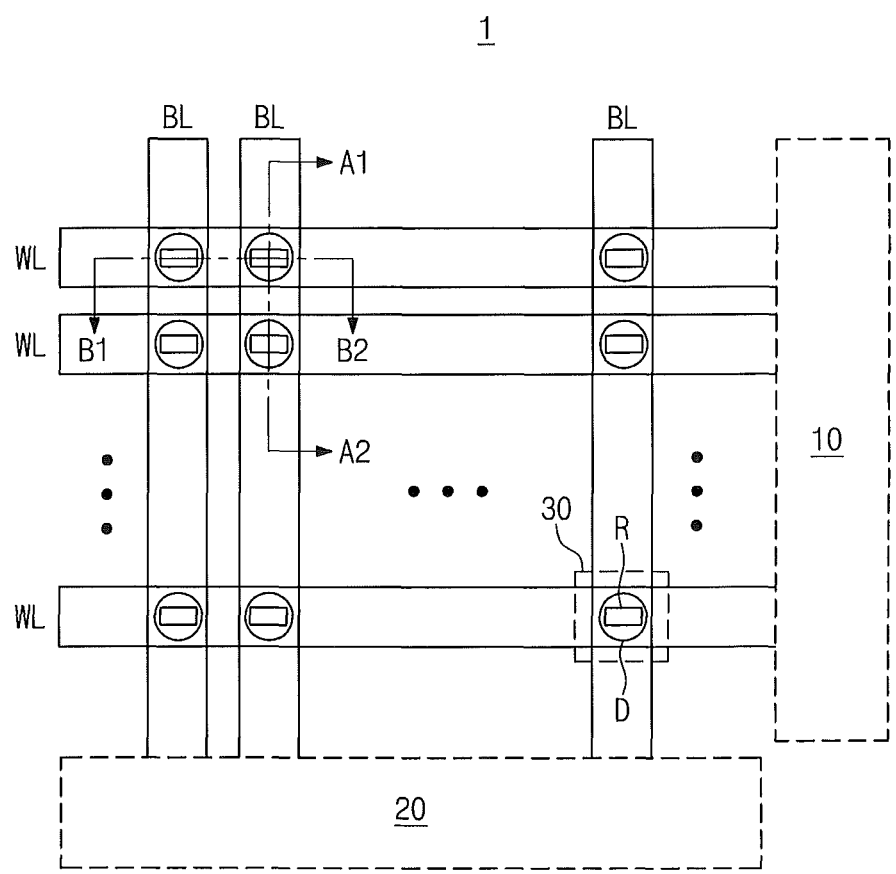
FIG. 1B is a plan view illustrating a phase-change memory device according to some embodiments of the inventive concept.

FIG. 1A is an equivalent circuit diagram of a phase-change memory device according to some embodiments of the inventive concept, and FIG. 1B is a plan view illustrating a phase-change memory device according to some embodiments of the inventive concept.

Referring to FIGS. 1A and 1B, a phase-change memory device 1 may include a plurality of bit lines BL, a plurality of word lines WL crossing the bit lines BL, and a plurality of memory cells 30 and a plurality of selection devices D which are provided at intersections of the bit lines BL and the word lines WL. The memory cell 30 may include a variable resistor R as a memory element. The variable resistor R may include a material whose crystal state can be changed by applying a signal, such as an electrical signal (e.g., voltage or current), an optical signal, or a radioactive ray.

The variable resistor R may include a phase-change material. The phase-change material may be a chalcogenide, e.g., an alloy of germanium (Ge), antimony (Sb) and tellurium (Te), whose phase and resistance can be changed with a change in temperature. Since the phase-change material is quickly changed into one of amorphous and crystalline state depending on temperature, it can be used for a semiconductor memory device. For example, the phase-change material has a high resistance, which may be referred to as a state 'RESET' or '1', in the amorphous state, and a low resistance, which may be referred to as a state 'SET' or '0', in the crystalline state. In certain applications, the states of RESET and SET may be reversely defined.

The variable resistor R may include one end connected to the bit line BL and other end connected to the word line WL through the selection device D. The selection device D may include a diode. In other embodiments, the selection device D may include a transistor.

The phase-change memory device 1 may include peripheral regions 10 and 20 provided with peripheral circuits, which may be electrically connected to the memory cell 30 to control the memory cells 30. The peripheral regions 10 and 20 may be disposed around the array of the memory cells to apply electrical signals to the memory cells 30. For example, the peripheral regions 10 and 20 may include a row decoder 10 which may control the word lines WL and a column decoder 20 which may control the bit lines BL.

Figure 2A:
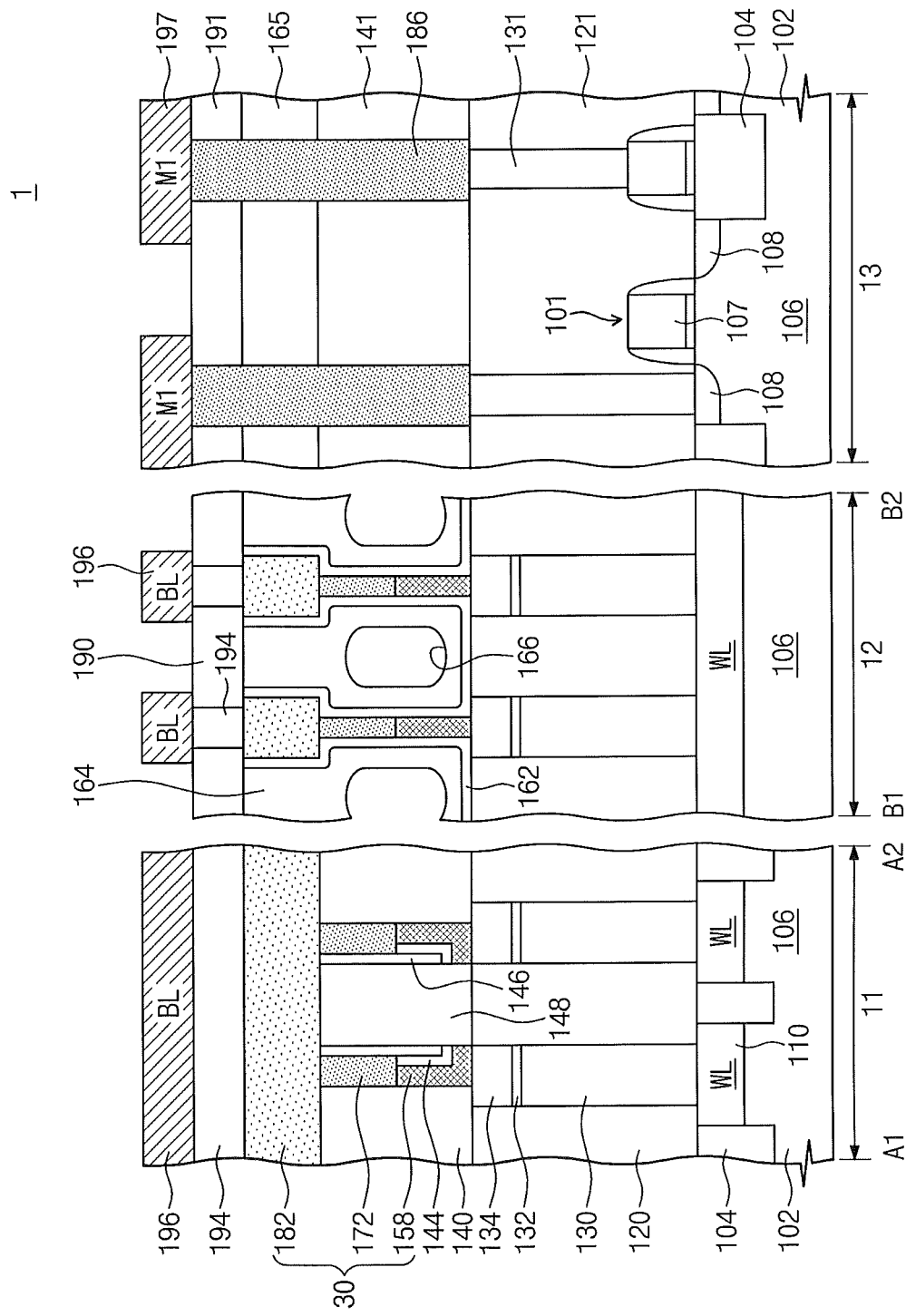
FIG. 2A is a sectional view illustrating a phase-change memory device according to some embodiments of the inventive concept.

FIG. 2A is a sectional view illustrating a memory cell array region and a peripheral region of a phase-change memory device according to some embodiments of the inventive concept.

In order to provide better understanding of embodiments of the inventive concepts, FIG. 2A shows both of vertical sections that are taken parallel to directions of the bit lines and word lines or taken along lines A1-A2 and B1-B2.

For example, in FIG. 2A, left-handed and central portions 11 and 12 may correspond to vertical sections of the cell array region that are taken along lines A1-A2 and B1-B2, respectively, of FIG. 1B, and a right-handed portion 13 may correspond to a vertical section of a peripheral region (e.g., of the decoder 10 and/or the column decoder 20).

Referring to FIG. 2A, in the memory cell array region or in the left-handed portion 11 and the central portion 12, there may be a plurality of word lines 110 provided in a semiconductor substrate 102. The word lines 110 may be electrically separated from each other by device isolation layers 104. A plurality of bit lines 196 may be provided on the semiconductor substrate 110 to cross the word lines 110. The memory cells 30 may be provided at intersections between the word lines 110 and the bit lines 196. In example embodiments, each of the memory cells 30 may include a phase-change layer 172 as a memory element.

Each of the memory cells 30 may include a pillar portion including a lower electrode 158 and the phase-change layer 172 and a linear portion including an upper electrode 182. Here, the upper electrode 182 may be wider than the lower electrode 158, and thus, each of the memory cells 30 may have a 'T'-shaped structure. The lower electrode 158 may be formed by a sidewall etching step and a top etching step, which will be described later with reference to FIGS. 3G and 3L, respectively. The phase-change layer 172 may serve as the variable resistor R of FIGS. 1A and 1B. In embodiments of the present application, the variable resistor R may refer to the phase-change layer 172. Alternatively, the variable resistor R may refer to a combination of the lower electrode 158, the phase-change layer 172 and the upper electrode 182. The memory cell 30 may include the variable resistor R (e.g., the combination of the lower electrode 158, the phase-change layer 172 and the upper electrode 182).

The lower electrode 158 and a diode 130 may be provided between the word line 110 and the phase-change layer 172. A contact plug 134 may be further provided between the diode 130 and the lower electrode 158. A silicide layer 132 may be further provided to reduce an electrical resistance between the contact plug 134 and the diode 130. The upper electrode 182 may be provided between the phase-change layer 172 and the bit line 196. The lower electrode 158 may be electrically connected to the word line 110 through the diode 130, and the upper electrode 182 may be electrically connected to the bit line 196 through an upper electrode contact 194. The lower electrode 158 may be provided to correspond to the phase-change layer 172. For example, the lower electrodes 158 may correspond to the phase-change layers 172, respectively.

A first interlayered insulating layer 120 may be provided on the semiconductor substrate 102. The diode 130, the silicide layer 132 and the contact plug 134 may be vertically aligned with each other and be sequentially stacked through the first interlayered insulating layer 120. A first mold layer 140, a gap-filling mold layer 148 and a second mold layer 164 may be provided on the first interlayered insulating layer 120. At least one of the mold layers 140, 148 and 164 may include an insulating material, such as a silicon nitride layer (e.g., SiN or $Si_3N_4$) or a silicon oxide layer (e.g., $SiO_2$).

The second mold layer 164 may be provided to define a thermal insulating region, such as air gap 166 between adjacent ones of the phase-change layers 172. Although an air gap is described in the embodiments for purposes of explanation, the thermal insulating region is not limited to an air gap, and may include a vacuum, a liquid or a solid material. A size of the air gap 166 may be changed depending on a deposition condition of the second mold layer 164. For example, in the case where the second mold layer 164 is formed using a deposition technique with a poor step coverage property (e.g., plasma deposition), the air gap 166 may be formed to have a relatively large size. Alternatively, in the case where the second mold layer 164 is formed using a deposition technique with a good step coverage property (e.g., thermal deposition or an atomic layer deposition), the air gap 166 may be formed to have a relatively small size. In example embodiments, the second mold layer 164 may be formed using a deposition technique with a poor step coverage property, and thus, the air gap 166 may be formed to have a relatively large size. Meanwhile, in the present application, the words of 'good', 'poor', 'large', and 'small' should be understood to be relative terms, not to express difference from any specific references.

The lower electrode 158 and the phase-change layer 172 may be vertically aligned to each other and be surrounded by the mold layers 140, 148 and 164 to have a dash shape in a plan view. The upper electrode 172 may be provided in the second mold layer 164 and have a line-shaped structure extending along the bit line 196. A second interlayered insulating layer 190 may be provided on the second mold layer 164, and the bit line 196 may be provided on the second interlayered insulating layer 190 and be connected to the upper electrode contact 194 that penetrates the second interlayered insulating layer 190.

In some embodiments, the lower electrode 158 and the phase-change layer 172 may not have a continuous shape extending along any direction but have an isolated or confined structure. As appreciated by the present inventors, in conventional approaches, in the case that one of the phase-change layers 172 adjacent to each other is heated, a phase of the other may be unintentionally changed by the heat generated in the neighboring cell; that is, there may be a thermal interference problem. According to some embodiments of the inventive concept, since the phase-change layer 172 is formed to have the confined structure, it is possible to reduce or prevent the thermal interference problem between adjacent cells. For example, the air gap 166 may serve as a thermal insulator, and thus, it is possible to suppress heat from being transferred between the adjacent ones of the phase-change layers 172. In other words, the prevention of the thermal interference may be enhanced by the presence of the air gap 166. Even if a distance between the phase-change layers 172 decreases with decreasing size of the phase-change memory device 1, the confined structure of the phase-change layer 172 and/or the presence of the air gap 166 makes it possible to suppress or minimize deterioration in electrical characteristics of the device 1 which may be caused by the thermal interference.

Each of the lower electrodes 158 may have an shaped section in a vertically sectional view. At least one of a first spacer 144 and a second spacer 146 may be provided on a sidewall of the lower electrode 158. In example embodiments, the first spacer 144 may include a silicon oxide layer, while the second spacer 146 may include a silicon nitride layer. An electrical current used for a phase transition of the phase-change layer 172 (e.g., a reset current, Ireset, required for a phase transition from a crystalline state to an amorphous state) may be substantially proportional to a contact area between the lower electrode 158 and the phase-change layer 172. According to some embodiments of the inventive concept, the lower electrode 158 may be slimmed, as will be described with reference to FIG. 3G, and thus, the contact area between the lower electrode 158 and the phase-change layer 172 may be reduced. Accordingly, it is possible to reduce the reset current of the device 1.

The phase-change layer 172 may have a pillar-shaped structure in a vertically sectional view. Both sidewalls of the phase-change layer 172 may be covered with a protection layer 162 including an insulating material (such as, a silicon nitride layer (e.g., SiN, $Si_3N_4$) or a silicon oxide layer (e.g., $SiO_2$)). Due to the presence of the protection layer 162, it is possible to prevent volatilization of the phase-change layer 172. In addition, the protection layer 162 may cover both sidewalls of each of the lower and upper electrodes 158 and 182 and/or a top surface of the first interlayered insulating layer 120. The protection layer 162 may extend parallel to the bit line 196.

Active devices (e.g., driving transistors 101) for operating the memory cells 30 may be provided on active regions 106 of the peripheral region, as shown in the right-handed portion 13. In example embodiments, the active regions 106 may be defined by the device isolation layer 104. The driving transistor 101 may be configured to apply electrical signals to the word line 110 and/or the bit line 196. A metal wire 197 on the peripheral region may be electrically connected to a gate 107 and/or a junction region 108 of the driving transistor 101. The metal wire 197 may be formed using the process of forming the bit line 196. The metal wire 197 may be electrically connected to the driving transistor 101 through a first contact 131 and a second contact 186. The first contact 131 may be formed using the process of forming the contact plug 134, and the second contact 186 may be formed using the process of forming the upper electrode contact 194. The driving transistor 101 and the first contact 131 may be formed in a first insulating layer 121, and the second contact 186 may be formed through a second insulating layer 141, a third insulating layer 165 and a fourth insulating layer 191. The first insulating layer 121 may be formed using the process of forming the first interlayered insulating layer 120. At least one of the second insulating layer 141 and the third insulating layer 165 may be formed using the process of forming at least one of the first mold layer 140 and the second mold layer 164. The fourth insulating layer 191 may be formed using the process of forming the second interlayered insulating layer 190.

Figure 2B:
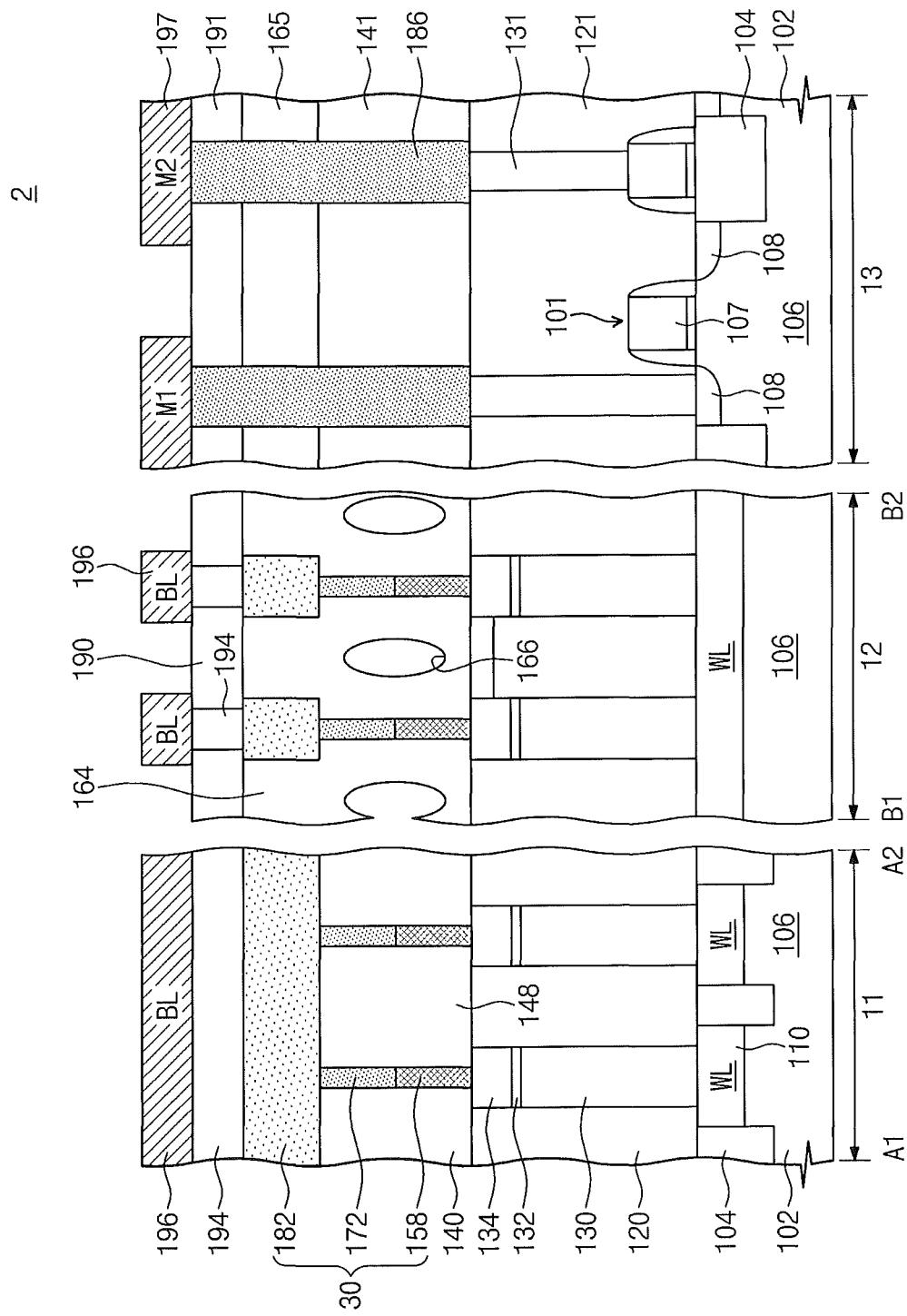
FIG. 2B is a sectional view illustrating a phase-change memory device modified from embodiments of FIG. 2A.

FIG. 2B is a sectional view illustrating a memory cell array region and a peripheral region of a phase-change memory device modified from that of embodiments shown in FIG. 2A. For the sake of brevity, elements and features similar to those embodiments of FIG. 2A will not be described in much further detail.

Referring to FIG. 2B, a phase-change memory device 2 may include the lower electrode 158 having a dash shape in a plan view and a pillar shape in a vertically sectional view. In some embodiments, the first spacer 144 and the second spacer 146 of FIG. 2A may not be provided on the sidewall of the lower electrode 158. The second mold layer 164 may be formed using a deposition process having a good step coverage property (e.g., a thermal deposition or an atomic layer deposition). As a result, the air gap 166 may be formed to have a relatively small size, and the protection layer 162 of FIG. 2A may not be formed on both sidewalls of the phase-change layer 172. In other embodiments, an equivalent circuit diagram and a plan view of the phase-change memory device 2 may be the same as those of FIGS. 1A and 1B, respectively.

Figure 3A:
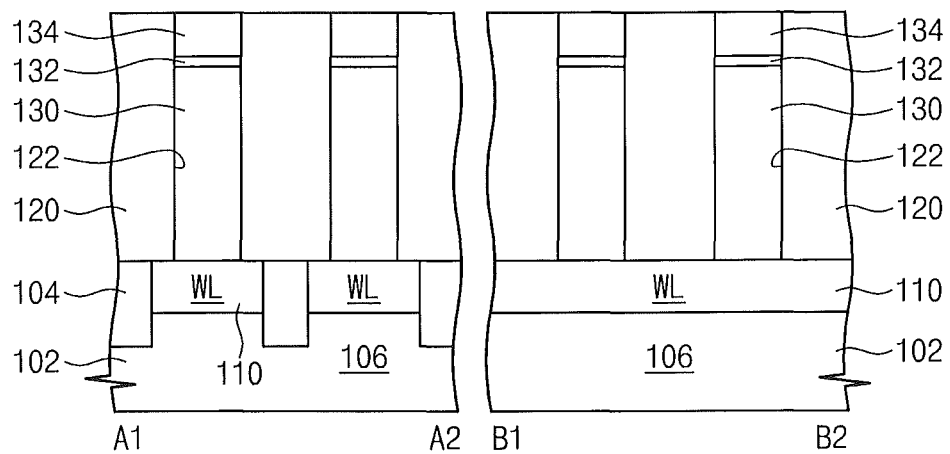
FIGS. 3A through 3R are sectional views illustrating a method of fabricating a phase-change memory device according to some embodiments of the inventive concept.
Figure 3B:
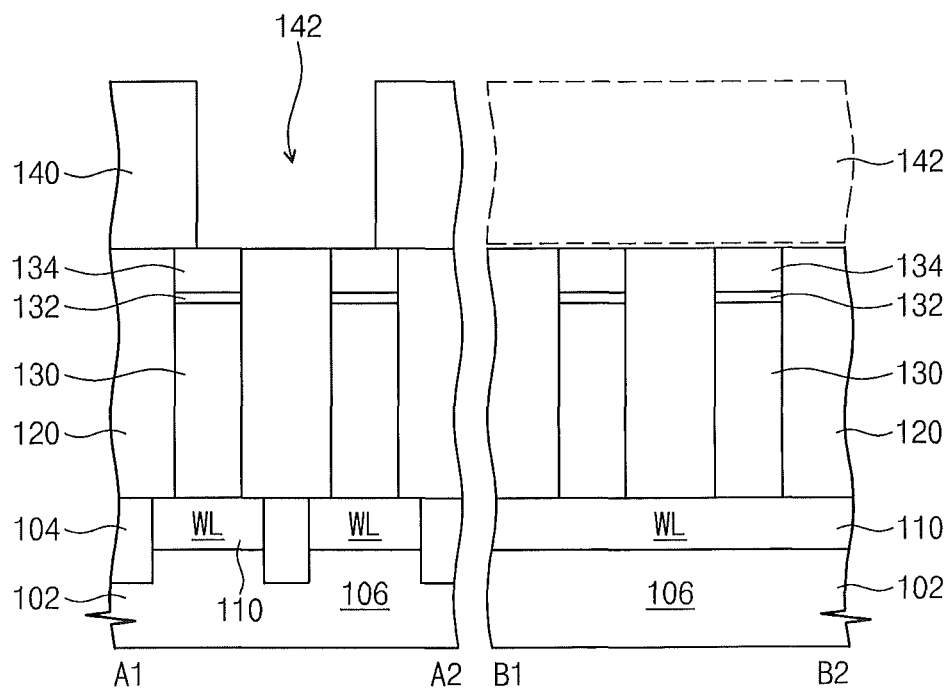
Figure 3C:
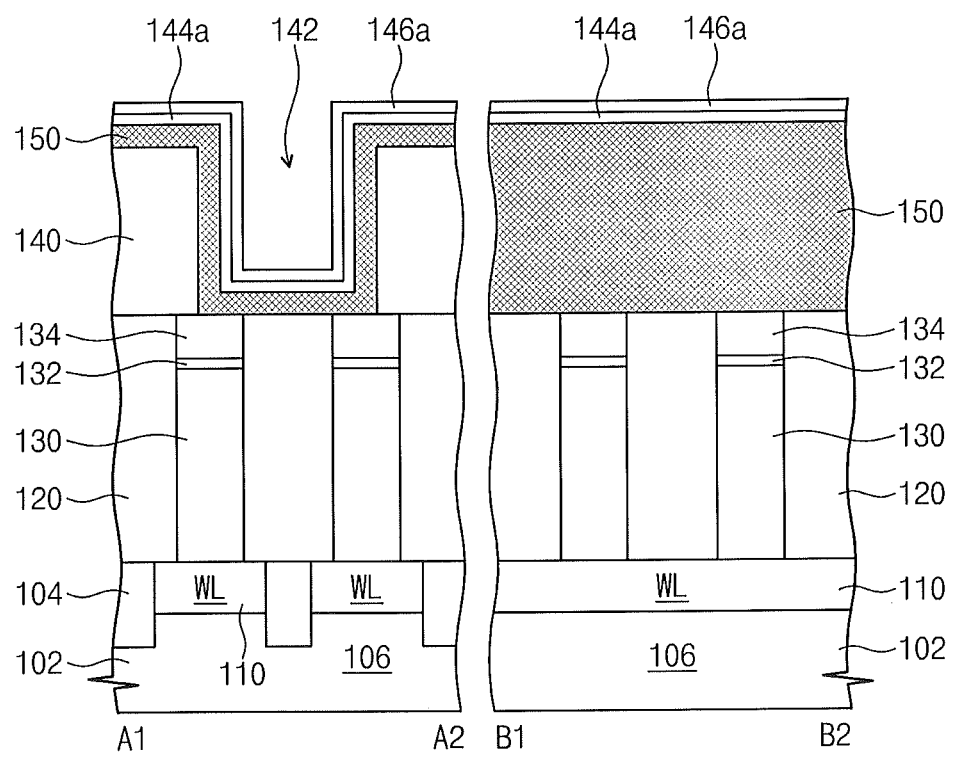
Figure 3D:
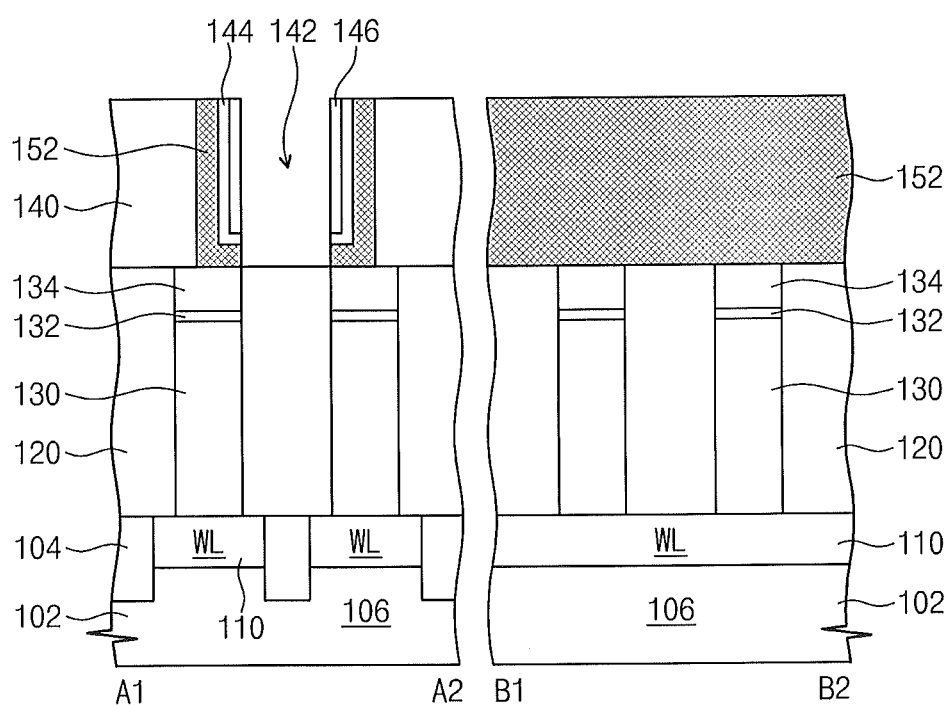
Figure 3E:
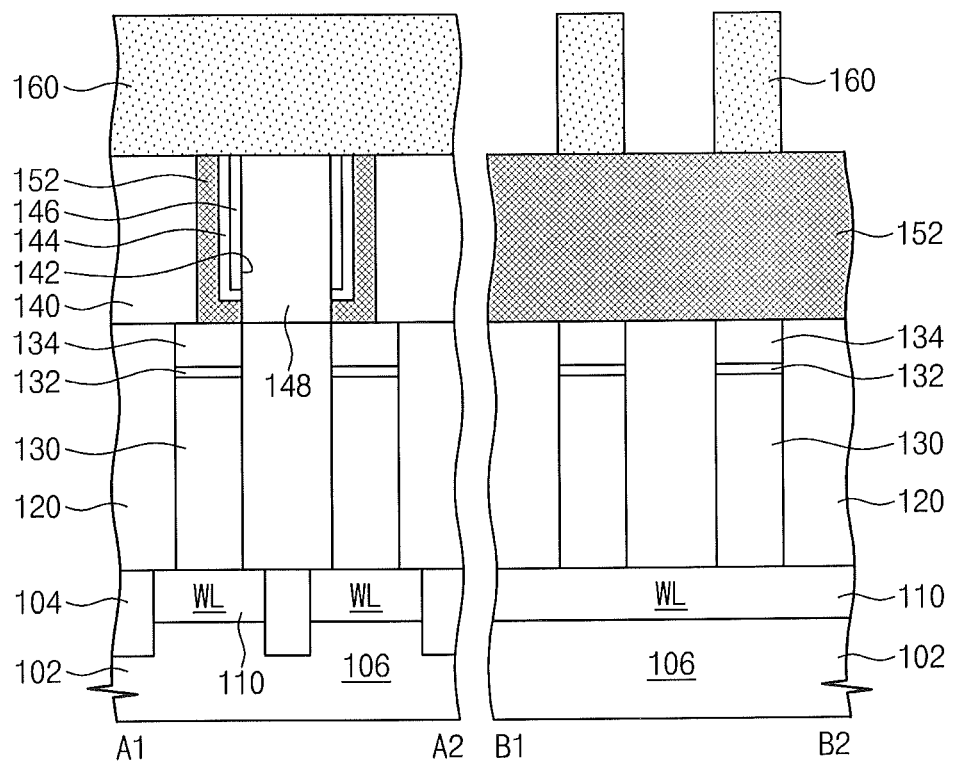
Figure 3F:
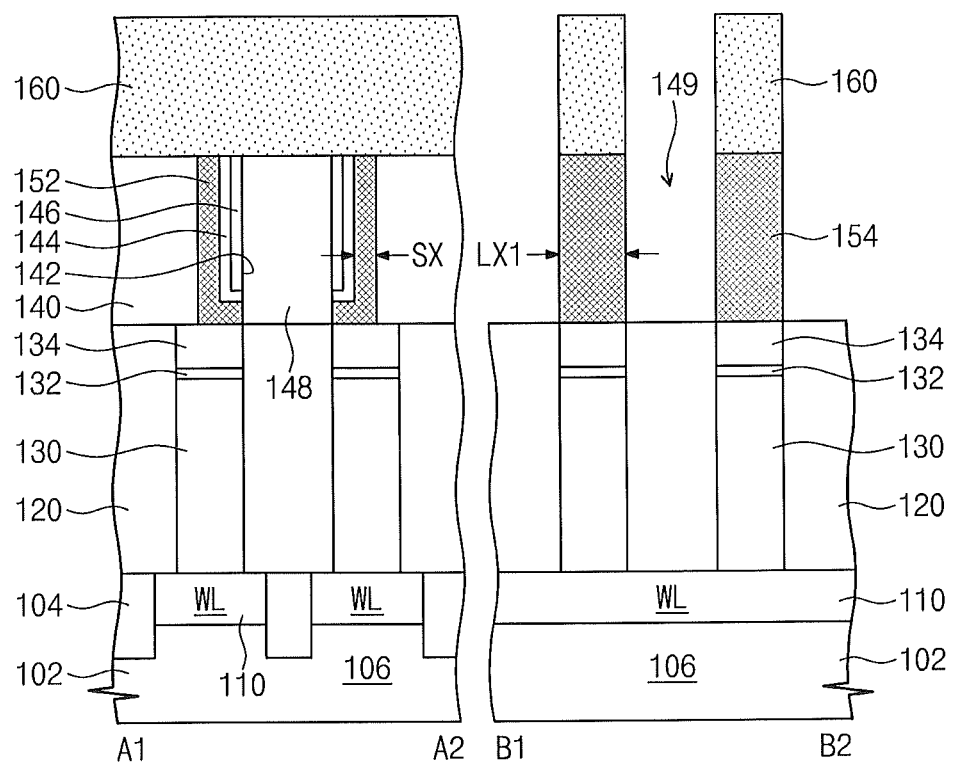
Figure 3G:
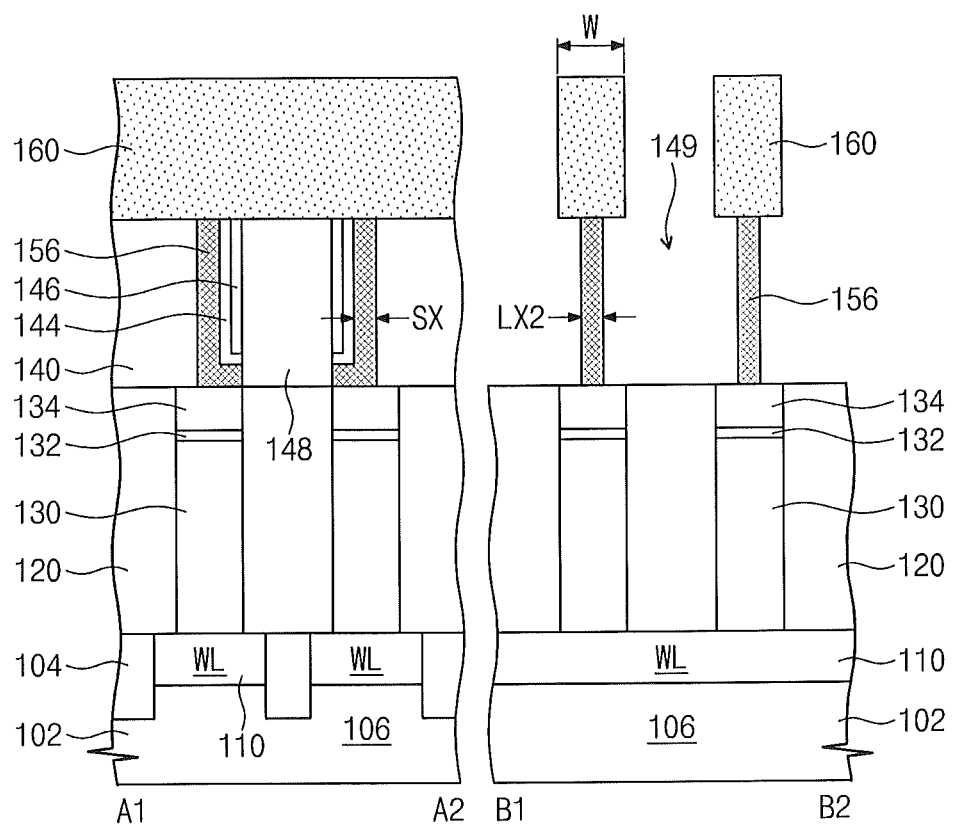
Figure 3H:
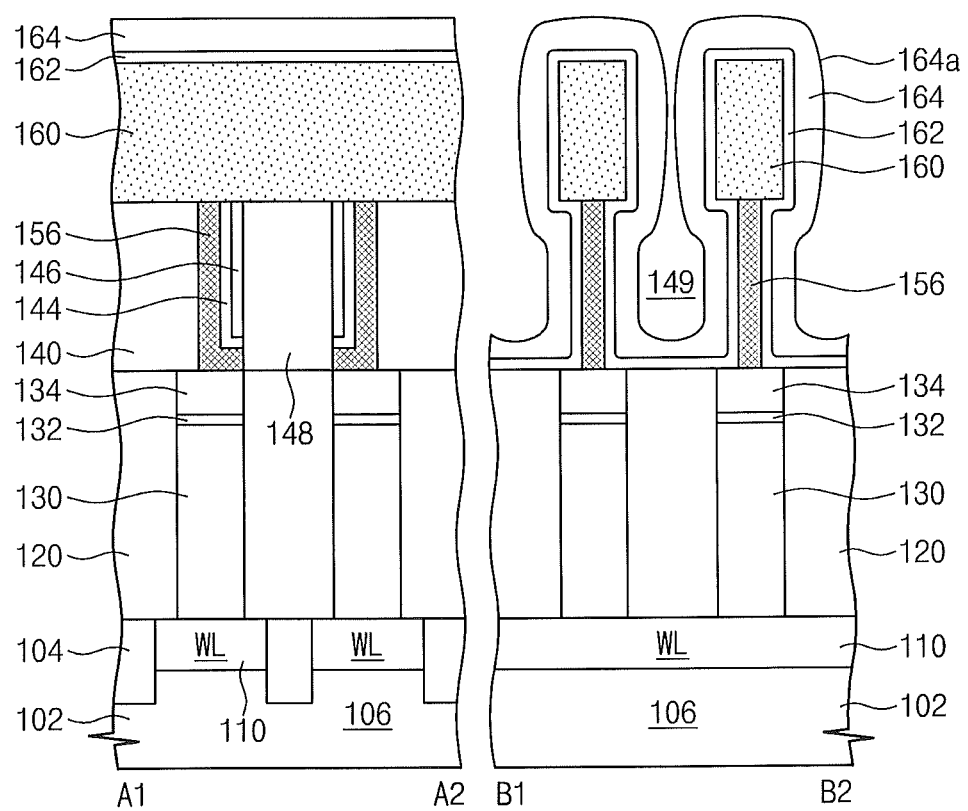
Figure 3I:
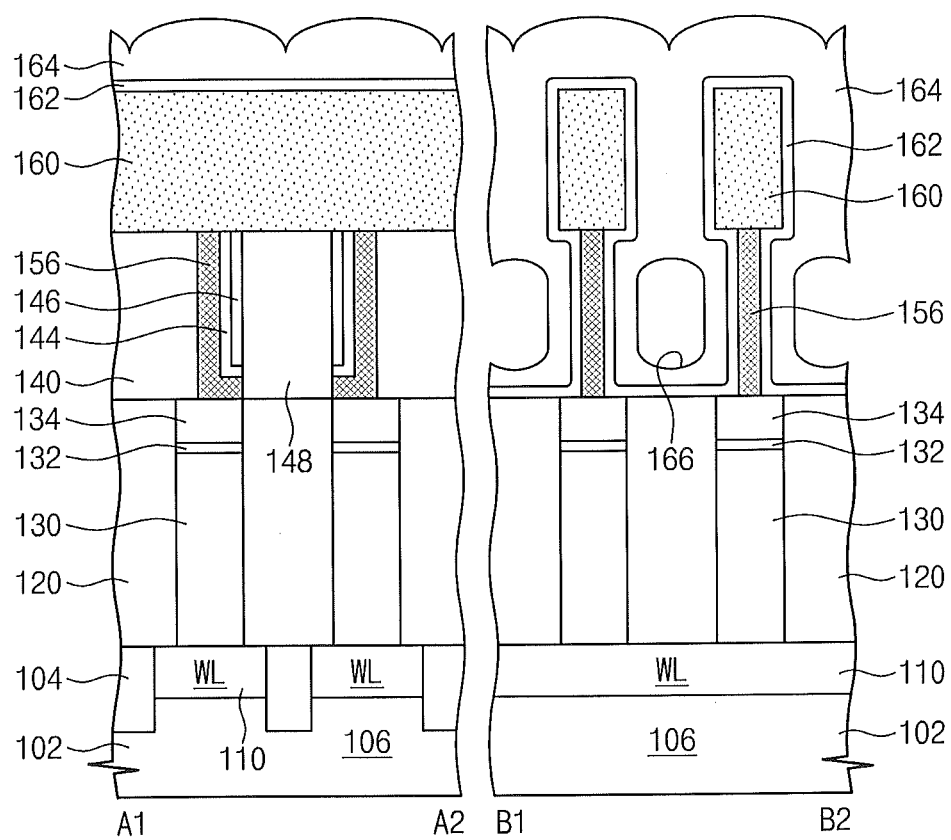
Figure 3J:
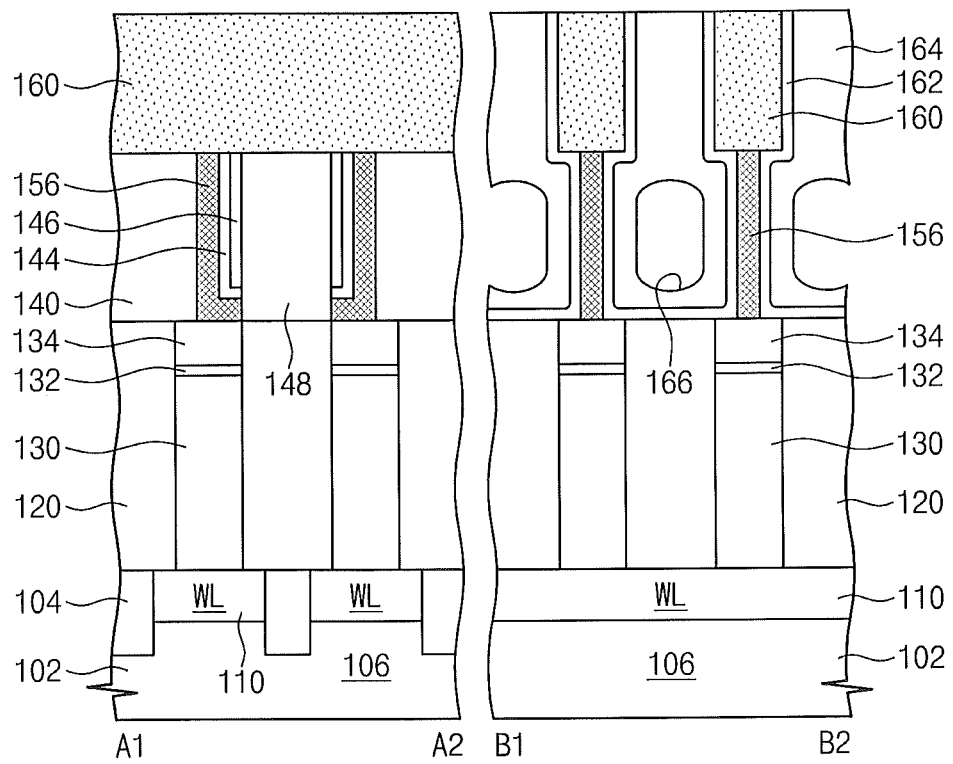
Figure 3K:
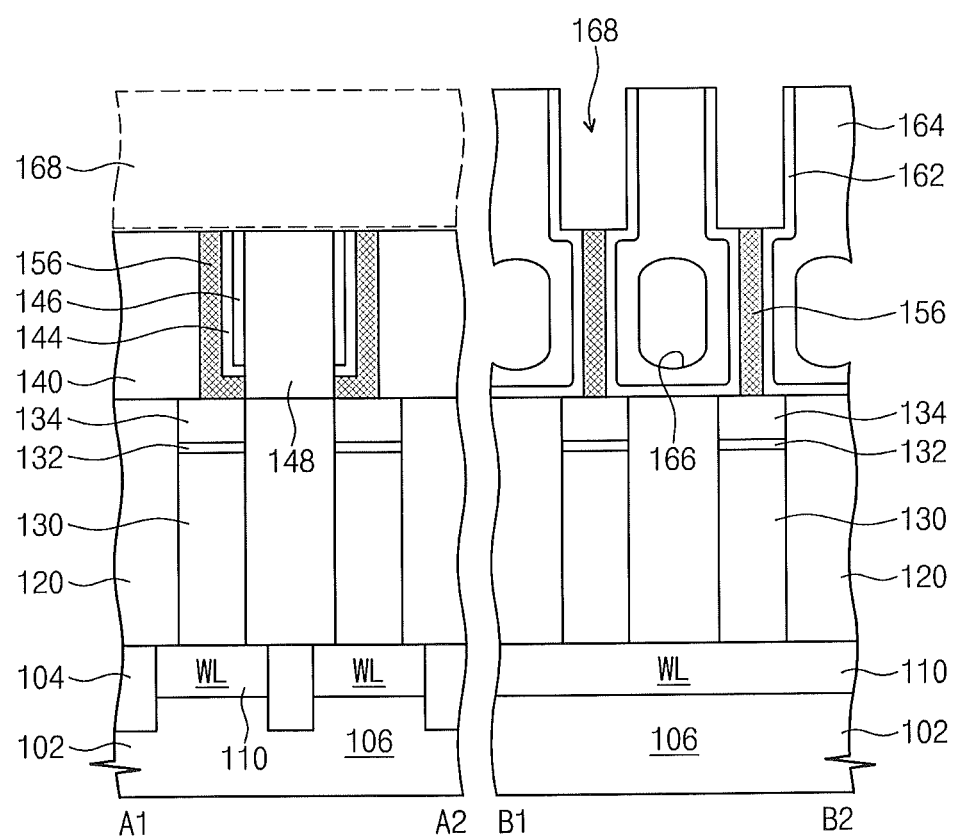
Figure 3L:
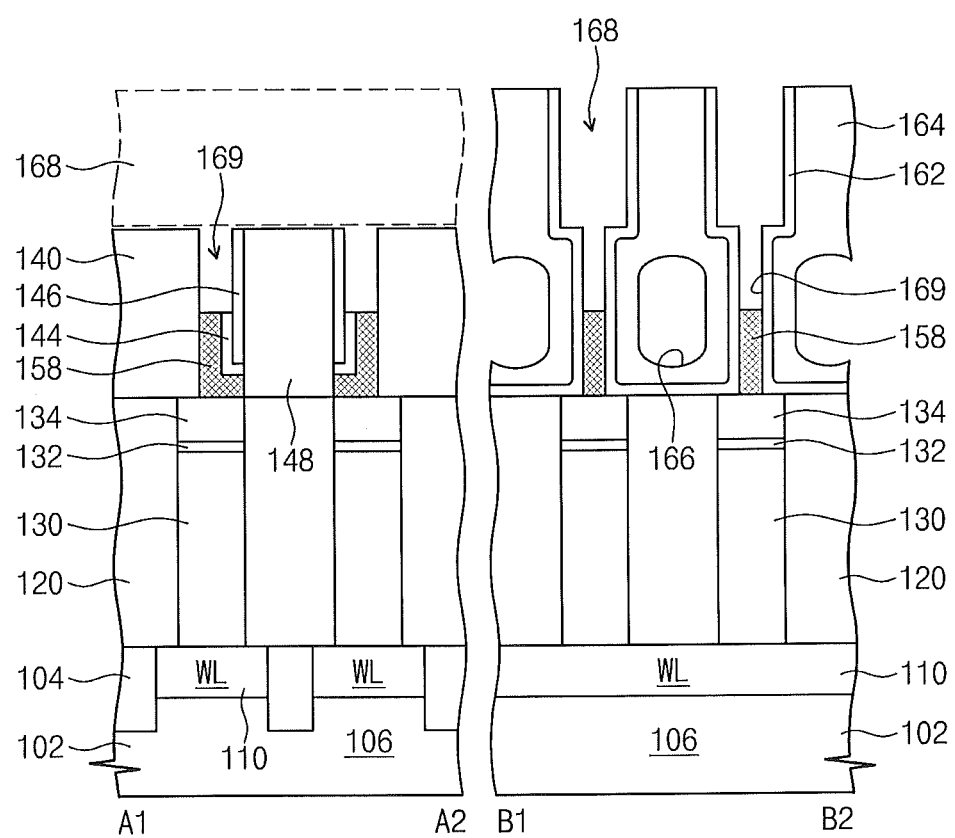
Figure 3M:
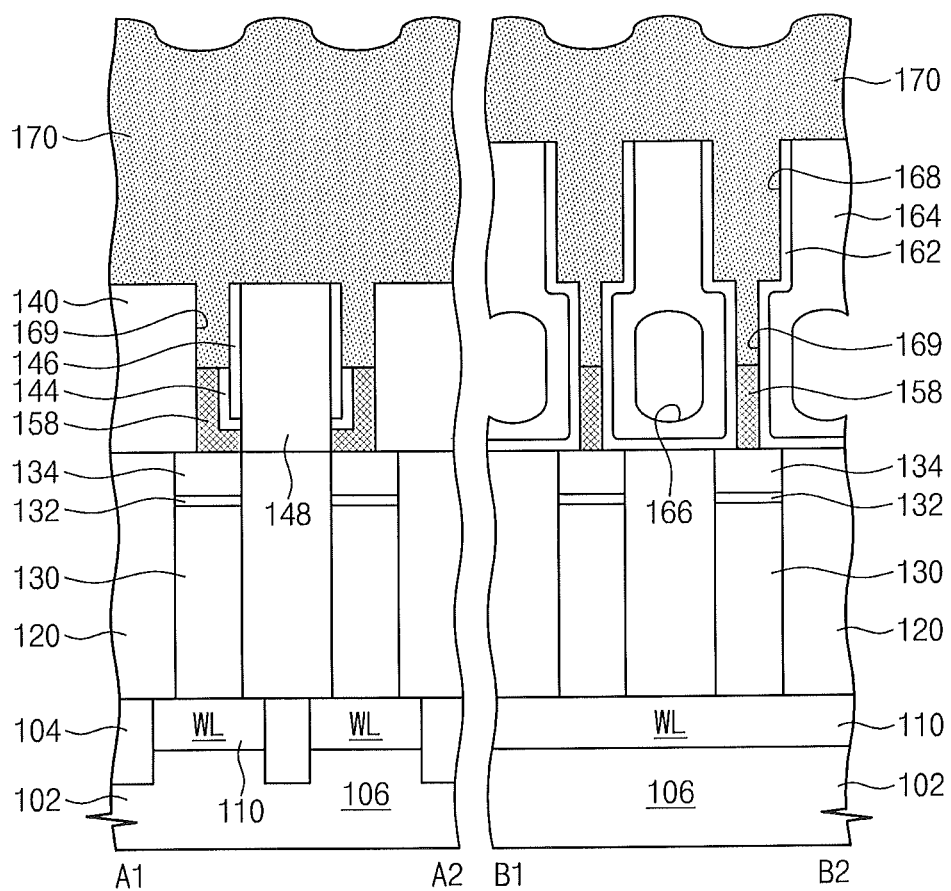
Figure 3N:
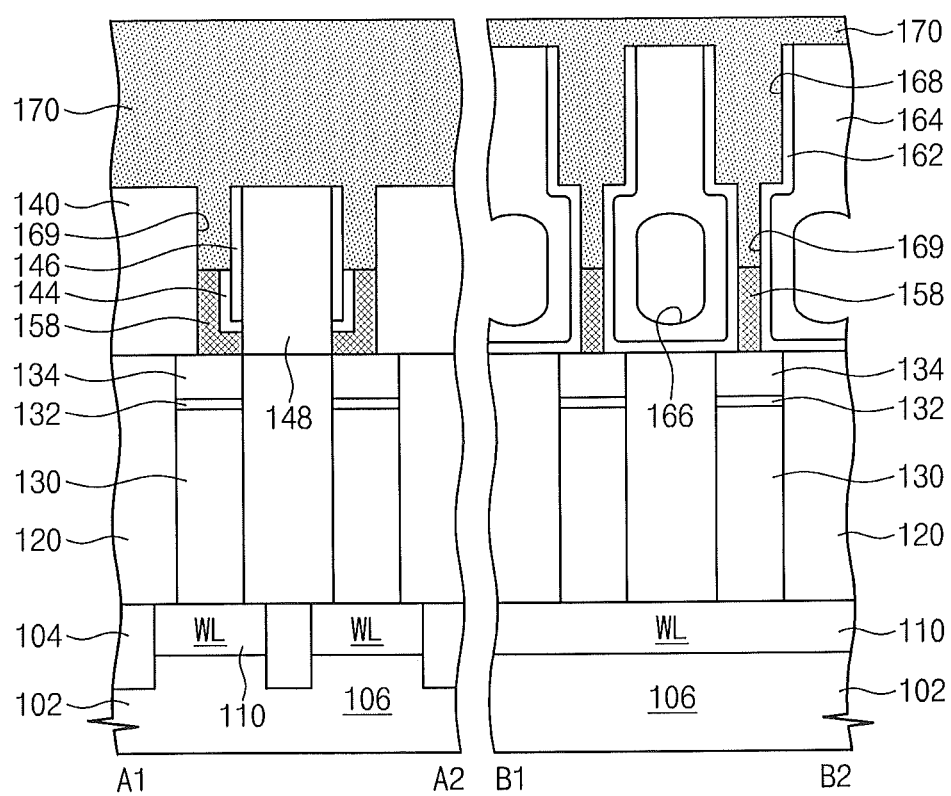
Figure 30:
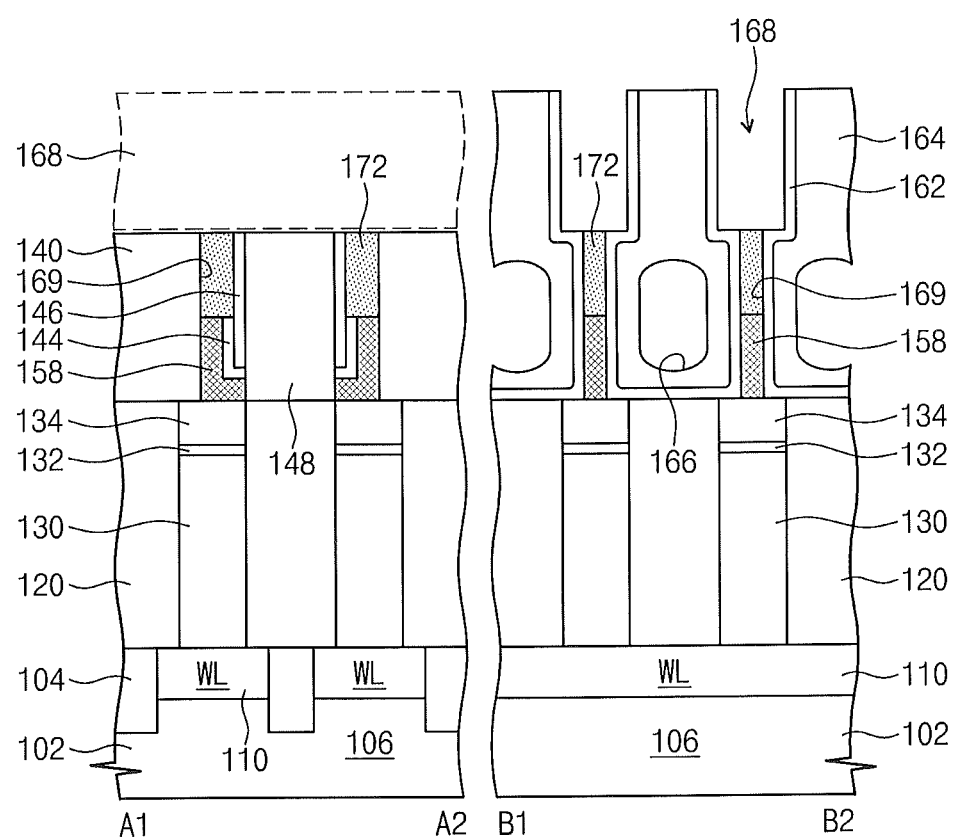
Figure 3P:
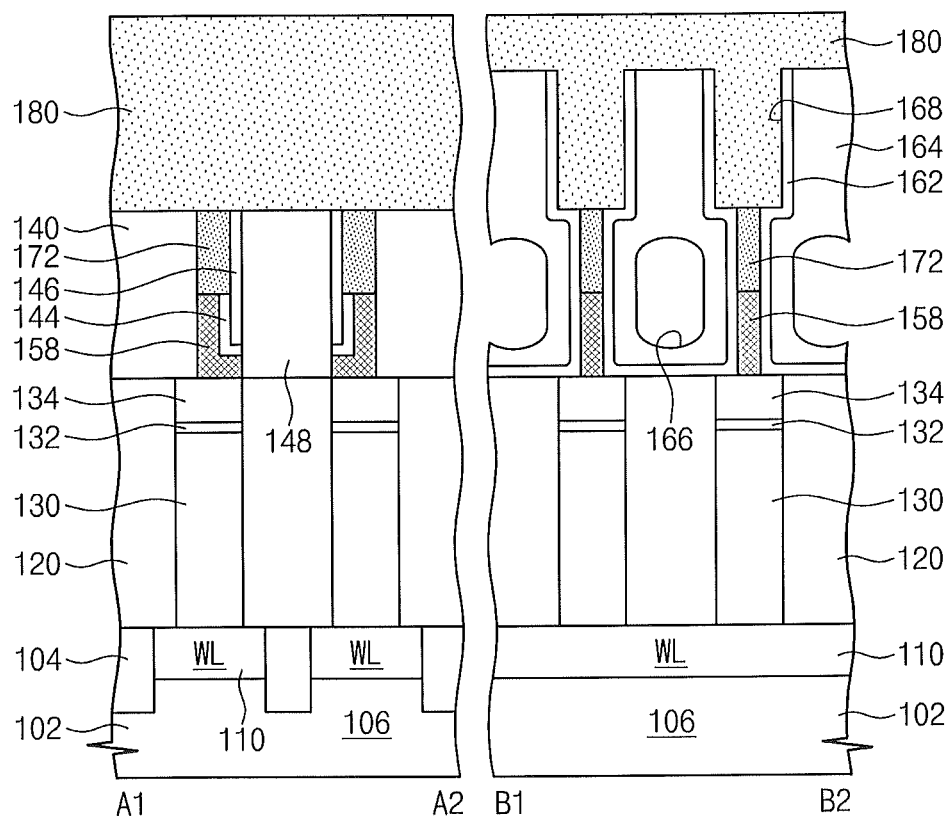
Figure 3Q:
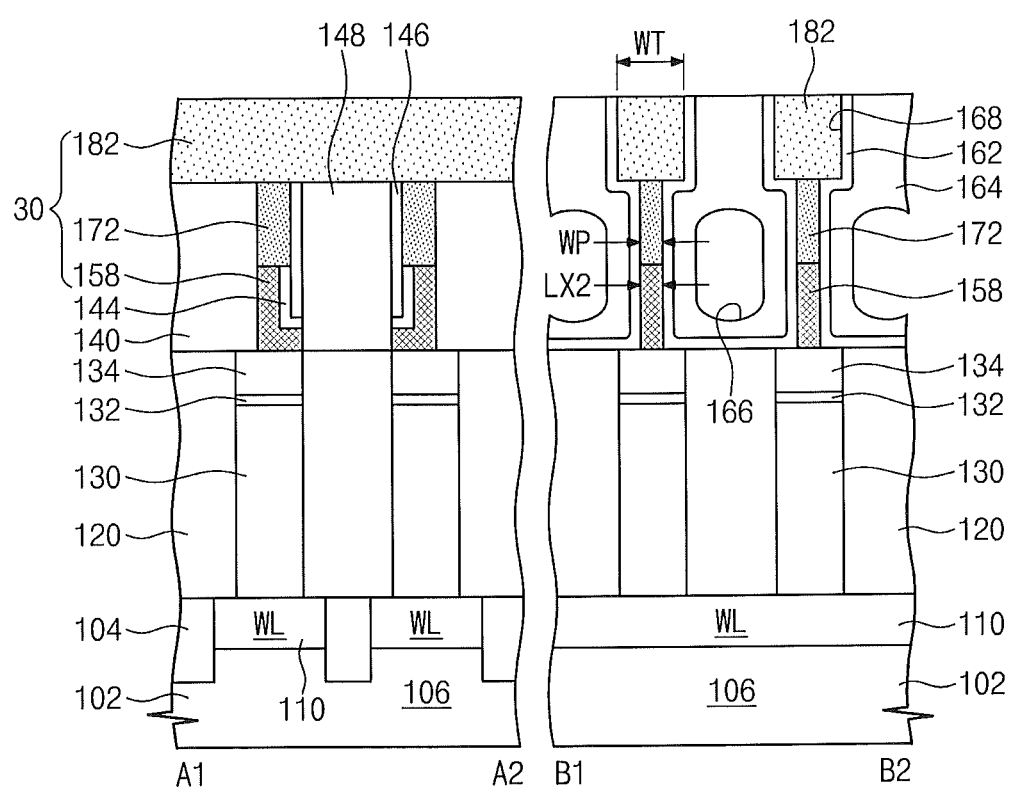
Figure 3R:
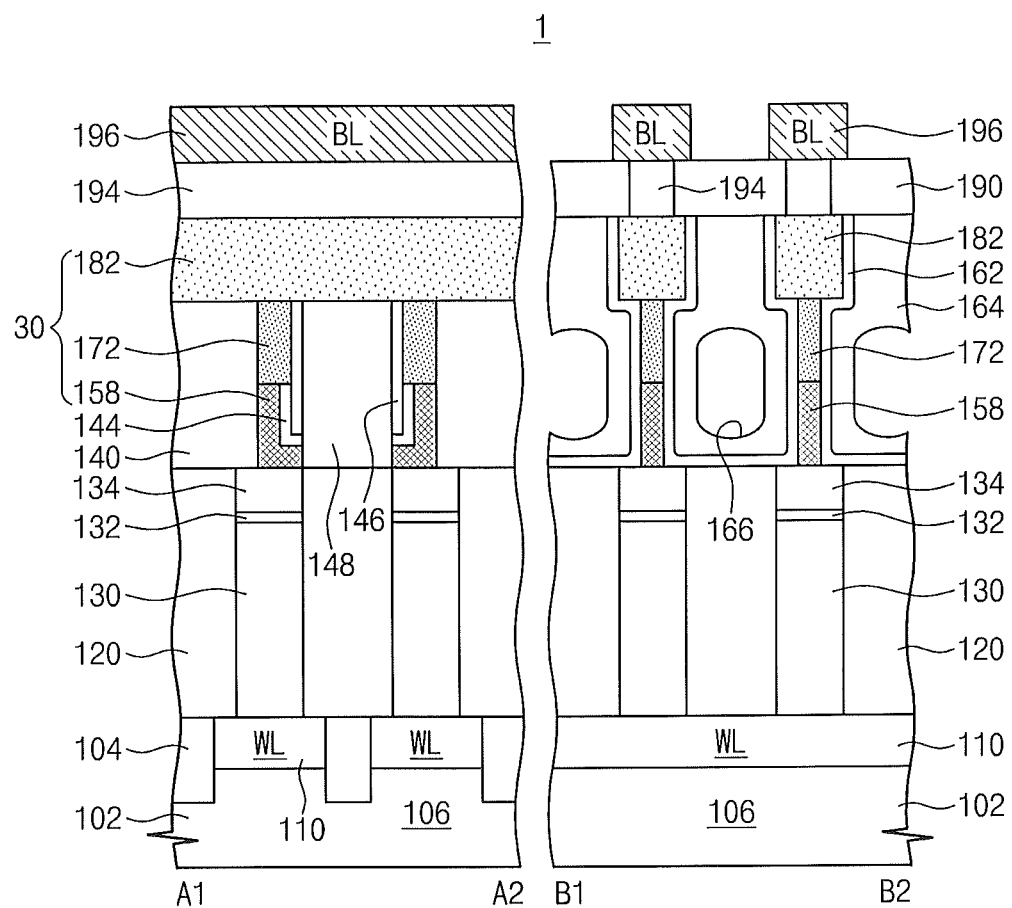

FIGS. 3A through 3R are sectional views illustrating a method of fabricating a phase-change memory device according to various embodiments of the inventive concept. In FIGS. 3A through 3R, left- and right-handed figures show sectional views taken along lines A1-A2 and B1-B2, respectively, of FIG. 1B.

Referring to FIG. 3A, a plurality of diodes 130 may be formed on a semiconductor substrate 102 and be electrically connected to a plurality of word lines 110, respectively. A plurality of contact plugs 134 may be formed to be connected to the diodes 130, respectively. Silicide layers 132 may be formed between the diodes 130 and the contact plugs 134. Each of the word lines 110 may be formed to extend along a direction parallel to the line B1-B2, which will be referred to as a B direction, on the semiconductor substrate 102.

In some embodiments, the semiconductor substrate 102 may include a silicon layer, a silicon-on-insulator (SOI) structure, a silicon germanium (SiGe) layer, a germanium (Ge) layer, a gallium arsenic (GaAs) layer, a silicon carbide (SiC) layer, a germanium nitride ($Ge_xN_y$) layer, or a silicon epitaxial layer supported by a semiconductor structure (e.g., of doped or undoped silicon). In some embodiments, the semiconductor substrate 102 may be a silicon wafer doped with P-type impurities.

A device isolation layer 104 may be formed on the semiconductor substrate 102 to define an active region 106, and the word line 110 may be formed in the active region 106. The device isolation layer 104 may be formed by, for example, a shallow trench isolation (STI) process. The word line 110 may be formed by injecting impurity ions into the active region 106. In the case where the semiconductor substrate 102 is a P-type silicon wafer, the word line 110 may be formed by injecting N-type impurity ions into the P-type silicon wafer. In other embodiments, the formation of the word line 110 may include forming an epitaxial semiconductor layer on the semiconductor substrate 102 and then doping the epitaxial semiconductor layer with impurities, or forming an epitaxial semiconductor layer simultaneously with doping impurities on the semiconductor substrate 102. In still other embodiments, the word line 110 may be formed by depositing a metal layer on the semiconductor substrate 102.

A first interlayered insulating layer 120 may be formed on the semiconductor substrate 110, a through hole 122 may be formed to expose the word line 110 through the first interlayered insulating layer 120, and the diode 130 may be formed in the through hole 122 to be electrically connected to the word line 110. The first interlayered insulating layer 120 may be formed by depositing an insulating material (e.g., $SiO_2$, SiN, $Si_3N_4$, or SiON). The formation of the diode 130 may include sequentially or reversely stacking P- and N-type semiconductor layers, or epitaxially growing one of P- and N-type semiconductor layers from the other. The silicide layer 132 may be formed of a metal silicide layer (e.g., CoSix, NiSix, or TiSix), thereby reducing an electrical resistance between the diode 130 and the contact plug 134. The contact plug 134 may be formed of a conductive material (e.g., W or Cu).

Referring to FIG. 3B, a first mold layer 140 having a first trench 142 may be formed on the semiconductor substrate 102. The first trench 142 may have a linear shape extending in the B direction along the word line 110 and partially expose a pair of the contact plugs 134, which are arranged adjacent to each other in a direction parallel to the line A1-A2 (hereinafter, referred as to an A direction), for example expose half or more a top area of each contact plug 134. The A and B directions may be substantially orthogonal to each other. In some embodiments, the formation of the first mold layer 140 may include depositing an insulating material on the first interlayered insulating layer 120 and etching the insulating material to form the first trench 142. The first mold layer 140 may be formed by depositing a silicon nitride layer (e.g., SiN or $Si_3N_4$).

Referring to FIG. 3C, a conductive layer 150 may be formed on the semiconductor substrate 102, and then, a first spacer layer 144a may be formed to cover the conductive layer 150. In addition, a second spacer layer 146a may be formed to cover the first spacer layer 144a. The conductive layer 150 may have a profile identical or similar to a surface profile of the semiconductor substrate 102 on which the first mold layer 140 is provided.

The conductive layer 150 may be formed by depositing a metal layer which may not be reacted with a phase-change layer 172 as described with reference to FIG. 3O and can generate enough heat to cause a phase transition of the phase-change layer 172. For example, the conductive layer 150 may include at least one of high-melting point metals (such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, or any combination thereof) or nitrides thereof. In example embodiments, the conductive layer 150 may include TiN.

The first and second spacer layers 144a and 146a may be formed of insulating materials different from each other. For example, the first spacer layer 144a may be formed by depositing a silicon oxide layer (e.g., $SiO_2$), and the second spacer layer 146a may be formed by depositing the same or similar material (for example, a silicon nitride layer (e.g., SiN or $Si_3N_4$)) as the first mold layer 140. In other embodiments, one of the first and second spacer layers 144a and 146a may not be formed.

Referring to FIG. 3D, the conductive layer 150 may be patterned to form a lower electrode layer 152. The lower electrode layer 152 may extend continuously along the B direction and be cut along the A direction to have a spacer shape or an isolated shape. For example, the second spacer layer 146a, the first spacer layer 144a, and the conductive layer 150 may be etched-back to form the lower electrode layer 152. During the etching process, the first interlayered insulating layer 120 may be exposed between the diodes 130 adjacent to each other in the A direction. In such an embodiment, the lower electrode layer 152 may extend continuously along the B direction, and it may be formed to have an 'L'-shaped section in contact with half or more the top area of the contact plug 134. As the result of the etching process, the first spacer layer 144a may form the first spacer 144 covering a side surface of the lower electrode layer 152, and the second spacer layer 146a may form the second spacer 146 covering the first spacer 144.

Referring to FIG. 3E, a gap-filling mold layer 148 may be formed to fill the first trench 142, and a mask layer 160 may be formed on the semiconductor substrate 102. The gap-filling mold layer 148 may be formed by depositing the same or similar material (for example, a silicon nitride layer (e.g., SiN or $Si_3N_4$)) as the first mold layer 140 and then planarizing it. The formation of the mask layer 160 may include depositing a material having an etch selectivity with respect to the first mold layer 140 and patterning it. The mask layer 160 may include an insulating material or a conductive material. In some embodiments, the mask layer 160 may include a conductive material or a polysilicon layer. The mask layer 160 may include portions separated from each other in the B direction. For example, the mask layer 160 may include linear portions extending along the A direction and being spaced apart from each other in the B direction.

Referring to FIG. 3F, the lower electrode layer 152 may be trimmed or patterned by an etching process using the mask layer 160, to form lower electrodes 154. The lower electrode layer 152 may be cut along the B direction to form the lower electrodes 154 that are separated from each other in both of the A and B directions. For example, as the result of the patterning of the lower electrode layer 152, a plurality of openings 149 may be formed to expose the first interlayered insulating layer 120. The openings 149 may arrange spaced apart from each other in the B direction to provide intervals between adjacent lower electrode layers 154. According to some embodiments of the inventive concept, the lower electrode 154 may have a dash shape with a minor axis SX and a first major axis LX1 locally placed on the diode 130, in a plan view, and have an "L" shape in contact with half or more the top area of the contact plug 134, in a vertically sectional view.

Referring to FIG. 3G, the lower electrode 154 may be etched to form a shrunk lower electrode 156 having the minor axis SX and a second major axis LX2 that is shorter than the first major axis LX1. For example, the sidewall of the lower electrode 154 may be recessed in the B direction by a wet etching process using an etchant which can etch the lower electrode 154 under the condition that the mask layer 160 is applied as an etch mask. Accordingly, the shrunk lower electrode 156 may be formed to have a slimly shrunk structure compared with the lower electrode 154. The second major axis LX2 of the shrunk lower electrode 156 may be smaller than a width W of the mask layer 160 along the B direction. As described with reference to FIG. 3F, the sidewall of the lower electrode 154 may be damaged during the etching process for forming the lower electrode 154. According to some embodiments of the inventive concept, since the sidewall of the lower electrode 154 is recessed, the damaged portion of the lower electrode 154 may be removed. Further, the opening 149 may expand toward the B direction, due to the sidewall recess of the lower electrode 154. In some embodiments, an etchant (e.g., hydrofluoric acid) for etching the first spacer 144 and an etchant (e.g., phosphoric acid) for etching at least one of the second spacer 146, the first mold layer 140 and the gap-filling mold layer 148 may be further supplied during the etching process for forming the shrunk lower electrode 156. As a result, the first spacer 144 and at least one of the second spacer 146, the first mold layer 140 and the gap-filling mold layer 148 may be etched and shrunk in the B direction.

Referring to FIG. 3H, a second mold layer 164 may be formed in the opening 149 to fill spaces between the shrunk lower electrodes 156 and between the mask layers 160. The second mold layer 164 may be formed of an insulating material (e.g., of SiN, $Si_3N_4$, or $SiO_2$) having an etch selectivity with respect to the mask layer 160. In some embodiments, before the formation of the second mold layer 164, a protection layer 162 may be further formed to cover the shrunk lower electrode 156 and the mask layer 160. The protection layer 162 may be formed by depositing the same or similar insulating material (such as, a silicon nitride layer (e.g., SiN, $Si_3N_4$) or a silicon oxide layer (e.g., $SiO_2$)) as the second mold layer 164.

According to some embodiments, the protection layer 162 may be formed to have a good step coverage compared with the second mold layer 164, and the second mold layer 164 may be formed to have a poor step coverage compared with the protection layer 162. In example embodiments, the protection layer 162 may be formed by depositing a silicon nitride layer through a thermal CVD process, and the second mold layer 164 may be formed by depositing a silicon nitride layer through a plasma-using process (e.g., PECVD). In other embodiments, the protection layer 162 may be formed by depositing a silicon nitride layer through an atomic layer deposition (ALD) process, and the second mold layer 164 may be formed by depositing a silicon nitride layer through a chemical vapor deposition (CVD) or physical vapor deposition (PVD) process. In the case where the second mold layer 164 is formed to have a poor step coverage, compared with the protection layer 162, an over-hang 164a may be formed between adjacent mask layers 160. Accordingly, the over-hang 164a may prevent the opening 149 from being completely filled with the second mold layer 164. Alternatively, even in the case where the over-hang 164a is not formed, space between the adjacent mask layers 160 may be filled in advance with the second mold layer 164 before filling the opening 149, because the space between the adjacent mask layers 160 is smaller than the width of the opening 149.

Referring to FIG. 3I, as the result of the deposition process of FIG. 3H, the second mold layer 164 may be formed to have an air gap 166 between the shrunk lower electrodes 156. As described with reference to FIG. 3H, the space between the adjacent mask layers 160 may be filled with the second mold layer 164 before filling the opening 149, and thus, the air gap 166 may be formed between the shrunk lower electrodes 156 adjacent to each other. An inner pressure of the air gap 166 may be equivalent to or lower than the atmospheric pressure. A size of the air gap 166 may be changed depending on a deposition condition of the second mold layer 164. For example, if the second mold layer 164 is formed to have a poor step coverage, the size of the air gap 166 may increase. By contrast, if the second mold layer 164 is formed to have a good step coverage, the size of the air gap 166 may decrease. In some embodiments, a plurality of the air gaps 166 may be arranged along the B direction on the word line 110.

Referring to FIG. 3J, the mask layer 160 may be exposed. For example, the second mold layer 164 may be planarized by a chemical-mechanical polishing process or an etch-back process until the mask layer 160 is exposed. During the planarization of the second mold layer 164, the protection layer 162 may be removed from a top surface of the mask layer 160.

Referring to FIG. 3K, the mask layer 160 may be removed to form second trenches 168. The removal of the mask layer 160 may be performed by a wet or dry etching, in which an etchant capable of selectively etching polysilicon layer is used. The second trenches 168 may be spaced apart from each other in the B direction, and each of the second trenches 168 may have a hollow line structure extending along the A direction. The shrunk lower electrode 156 may be exposed through the second trench 168. The second trench 168 may provide a space for an upper electrode 182 to be formed in a subsequent process. This may mean that there is no need to perform additional photolithography and/or etching processes for forming the space, in which the upper electrode 182 will be formed.

Referring to FIG. 3L, a recessed lower electrode 158 and a plug hole 169 may be formed. For example, an upper portion of the shrunk lower electrode 156 may be partially removed by a wet or dry etching process using an etchant capable of selectively etching the shrunk lower electrode 156 to thereby form the recessed lower electrode 158. The plug hole 169 may be formed below the second trench 168 and be aligned with the recessed lower electrode 158 in a plan view. The plug hole 169 may provide a space for the phase-change layer 172 that will be formed in a subsequent process. This may mean that there is no need to perform additional photolithography and/or etching processes for forming the space, in which a phase-change layer 172 will be formed. During the etching process for forming the plug hole 169, a hydrofluoric acid may be additionally provided to recess the first spacer 144.

Referring to FIG. 3M, a phase-change layer 170 may be formed on the semiconductor substrate 102. The phase-change layer 170 may be formed to fill the second trench 168 and the plug hole 169 and have a non-separated or continuous structure. The phase-change layer 170 may be formed by depositing a phase-changeable material, whose crystal structure can be reversibly switched to one of high resistance amorphous and low resistance crystalline phases by heat applied thereto and its applying time. The phase-changeable material may include at least one selected from the group consisting of Te, Se, Ge, Sb, Bi, Pb, Sn, In, Ag, As, S, Si, P, O, and mixtures thereof.

For example, the phase-change layer 170 may be formed by depositing one or more of chalcogenides, such as GeSbTe, GeTeAs, GeBiTe, GeTeTi, GeTeSe, AsSbTe, SnSbTe, SeT-eSn, SbSeBi, SnSbBi, GaTeSe, InSbTe, GeTe, InSe, SbTe, InSnSbTe, AgInSbTe, and AsGeSbTe. Alternatively, the phase-change layer 170 may be formed of a doped chalcogenide. In example embodiments, at least one of nitrogen (N), oxygen (O), silicon (Si), carbon (C), boron (B), or dysprosium (Dy) may be contained as impurities in the doped chalcogenide.

Referring to FIG. 3N, a top surface of the phase-change layer 170 may be etched. For example, the phase-change layer 170 may be planarized using a chemical-mechanical polishing or etch-back process, thereby having a reduced thickness. The planarization may be performed until the second mold layer 164 is exposed or not. Since the phase-change layer 170 has the reduced thickness, it is possible to relieve an etching burden in a step of forming a phase-change layer 172, which will be described with reference to FIG. 3O.

Referring to FIG. 3O, the phase-change layer 170 may be recessed to form the phase-change layer 172 localized in the plug hole 169. In some embodiments, the recess of the phase-change layer 170 may be performed using an etching process, in which plasma (e.g., Ar plasma, $H_2$ plasma) is used, and thus, the phase-change layer 172 may be self-aligned with the lower electrode 158. As the result of the recess of the phase-change layer 170, the second trench 168 may be exposed again. In a plan view, the phase-change layer 172 may be overlapped with the lower electrode 158 and have a dash shape. Adjacent ones of the phase-change layers 172 may be separated from each other by the air gap 166.

Referring to FIG. 3P, an upper electrode layer 180 may be formed on the semiconductor substrate 102 to fill the second trench 168. The upper electrode layer 180 may be formed by depositing the same or similar material as the lower electrode 158. For example, the upper electrode layer 180 may include at least one of high-melting point metals (such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, or any combination thereof) or nitrides thereof. In example embodiments, the upper electrode layer 180 may include TiN.

Referring to FIG. 3Q, the upper electrode layer 180 may be recessed to form the upper electrode 182 filling the second trench 168. For example, the recessing of the upper electrode layer 180 may be performed using a planarization process, such as a chemical-mechanical polishing or etch-back process, and thus, the upper electrode 182 may be self-aligned with the phase-change layer 172. A width WT of the upper electrode 182 may be greater than the second major axis LX2 of the recessed lower electrode 158, when measured along the B direction. A width WP of the phase-change layer 172 may be substantially equivalent to the second major axis LX2 of the recessed lower electrode 158, when measured along the B direction. During the planarization of the upper electrode layer 180, the second mold layer 164 and the protection layer 162 may be partially removed to form a substantially flat top surface. In some embodiments, the recessed lower electrode 158, the phase-change layer 172, and the upper electrode 182 may be self-aligned to constitute a unit structure (hereinafter, referred as to a phase-change memory cell 30). The memory cell 30 may include a pillar portion and a linear portion thereon and having a 'T'-shaped structure, where the pillar portion may include the recessed lower electrode 158 and the phase-change layer 172, which are sequentially stacked and have the same width, i.e., WP=LX2, and the linear portion may include the upper electrode 182, which may be stacked on the phase-change layer 172 and have a width WT greater than WP. The protection layer 162 may be formed to cover both sidewalls of the memory cell 30 and a top surface of the first mold layer 120 and have a structure extending along the A direction.

Referring to FIG. 3R, a bit line 196 may be formed in such a way that it is electrically connected to the memory cell 30.

In example embodiments, before the formation of bit line 196, a second interlayered insulating layer 190 may be formed on the semiconductor substrate 102 by depositing an insulating material (e.g., $SiO_2$), and an upper electrode contact 194 may be electrically connected to the upper electrode 182 through the second interlayered insulating layer 190. The formation of the bit line 196 may include depositing a conductive layer (e.g., of at least one of Ti, W, Si, Cu, Ta, Mo, Ru, Al, Au, Pt, Ag, or alloys thereof) on the second interlayered insulating layer 190 and pattering the conductive layer to form the bit line 196 coupled to the upper electrode contact 194. The bit line 196 may extend along the A direction and cross the word line 110 extending the B direction. A phase-change memory device 1 according to some embodiments of the inventive concept may be fabricated, as the result of the series of the above processes.

FIGS. 4A through 4G are sectional views illustrating a method of fabricating a phase-change memory device according to other embodiments of the inventive concept. In FIGS. 4A through 4G, left- and right-handed ones show sectional views taken along lines A1-A2 and B1-B2, respectively, of FIG. 1B. For the sake of brevity, elements and features similar to those of FIGS. 3A through 3R will not be described in much further detail.

Figure 4A:
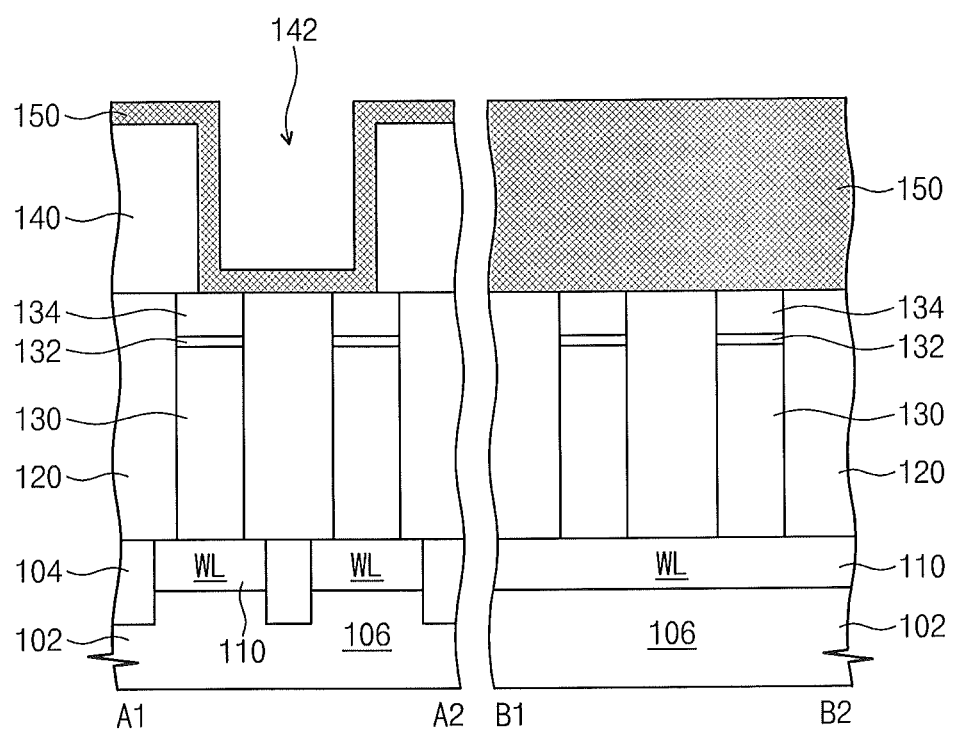
FIGS. 4A through 4G are sectional views illustrating a method of fabricating a phase-change memory device according to other embodiments of the inventive concept.

Referring to FIG. 4A, the first mold layer 140 may be formed on the first interlayered insulating layer 120 to define the first trench 142, and the conductive layer 150 may be conformally deposited on the first mold layer 140. For example, the formation of the first mold layer 140 may include depositing an insulating material, such as a silicon nitride layer (e.g., SiN) on the first interlayered insulating layer 120 and patterning the insulating material to form the first trench 142 extending along the B direction. The first trench 142 may be formed to expose half or more of the top area of a pair of the contact plugs 134 that are disposed adjacent to each other in the A direction. The conductive layer 150 may be formed of for example, a TiN layer, which may be deposited using a physical vapor deposition (PVD) or a chemical vapor deposition (CVD). A deposition thickness of the conductive layer 150 may be less than that required for completely filling first trench 142.

Figure 4B:
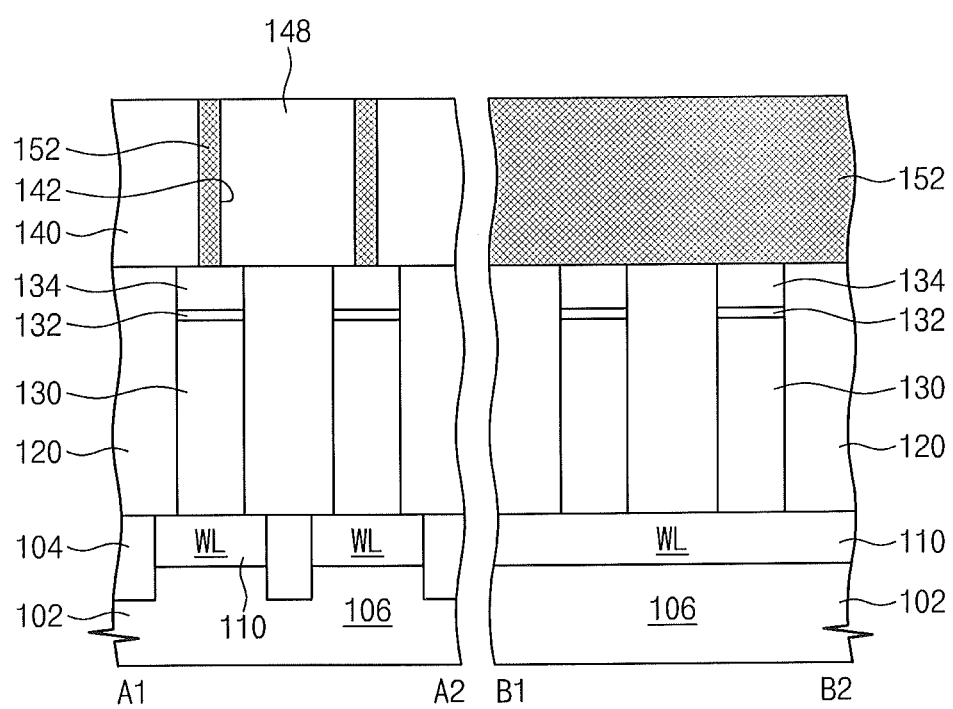

Referring to FIG. 4B, the conductive layer 150 may be etched to form the lower electrode layers 152 continuously extending along the B direction and being separated from each other in the A direction. For example, the formation of the lower electrode layer 152 may include etching back the conductive layer 150, and thus, the lower electrode layer 152 may be provided in the form of a spacer, on the sidewall of the first trench 142. Thereafter, a silicon nitride layer (e.g., of SiN or $Si_3N_4$) may be deposited and planarized to form the gap-filling mold layer 148 filling the first trench 142. According to the present embodiment, the lower electrode layer 152 may extend along the sidewall of the first trench 142 or along the B direction and have a pillar structure vertically standing on the top surface of the contact plug 134.

Figure 4C:
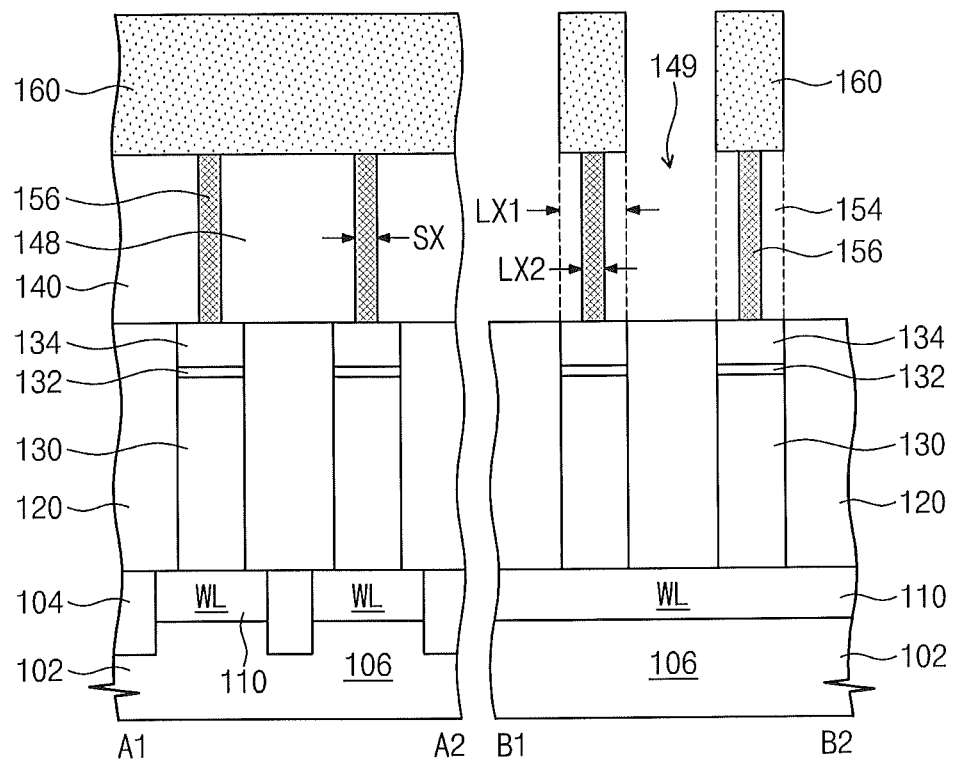

Referring to FIG. 4C, the mask layer 160 may be formed on the semiconductor substrate 102. For example, the formation of the mask layer 160 may include depositing a polysilicon layer on the semiconductor substrate 102 and patterning it to form a plurality of linear portions, which are spaced apart from each other in the B direction and extend along the A direction. The lower electrode layer 152 may be trimmed or patterned by an etching process using the mask layer 160, to form the lower electrodes 154, which are separated from each other in both of the A and B directions, and each of the lower electrode 154 has the minor axis SX and the first major axis LX1. Thereafter, the lower electrodes 154 may be additionally etched to form the shrunk lower electrodes 156, each of the shrunk lower electrode 156 has the minor axis SX and the second major axis LX2 that is smaller than the first major axis LX1. The openings 149 may be formed between the shrunk lower electrodes 156 to expose the first interlayered insulating layer 120.

Figure 4D:
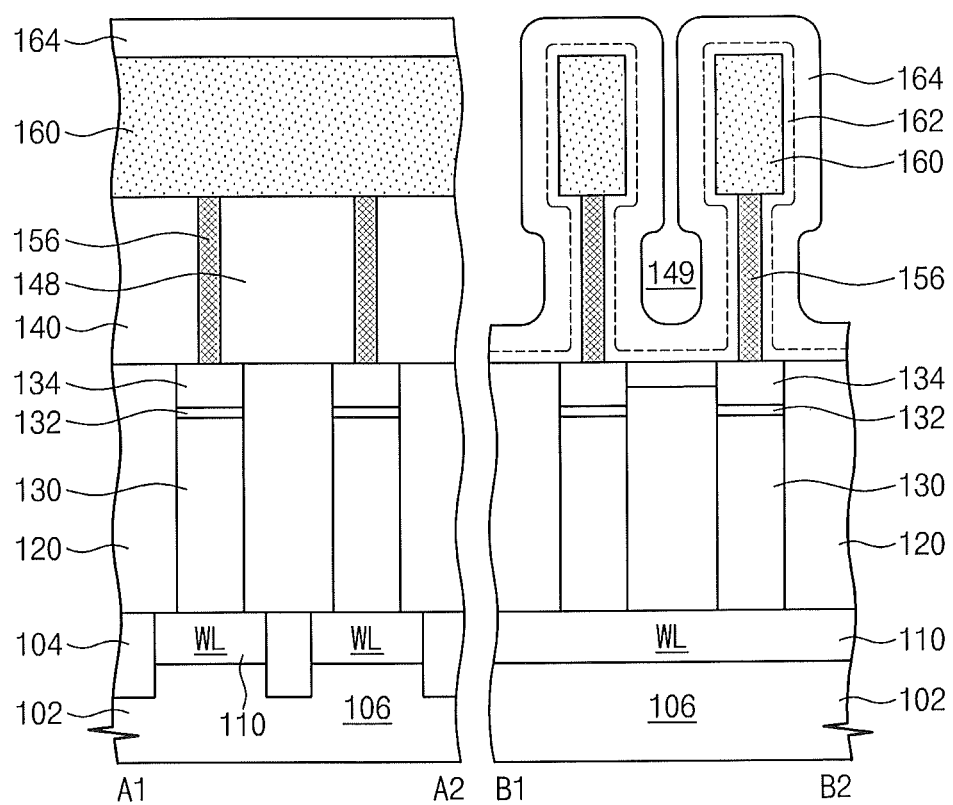

Referring to FIG. 4D, the second mold layer 164 may be formed to fill spaces between the shrunk lower electrodes 156 and the mask layers 160. In example embodiments, the second mold layer 164 may be formed by depositing an insulating material (e.g., silicon nitride or silicon oxide) having an etch selectivity with respect to the mask layer 160 on the resulting structure with the opening 149. For example, the second mold layer 164 may be formed of an ALD or CVD silicon nitride layer (e.g., of SiN or $Si_3N_4$). According to the present embodiment, the second mold layer 164 may be formed to have a good step coverage, compared to the case that it is formed by a physical vapor deposition process. In this case, since the opening 149 is covered with the second mold layer 164 with the relatively good step coverage, it is possible to prevent volatilization of the shrunk lower electrode 156, even when the formation of the protection layer 162 may be skipped. In other embodiments, the protection layer 162 may be further formed before the formation of the second mold layer 164.

Figure 4E:
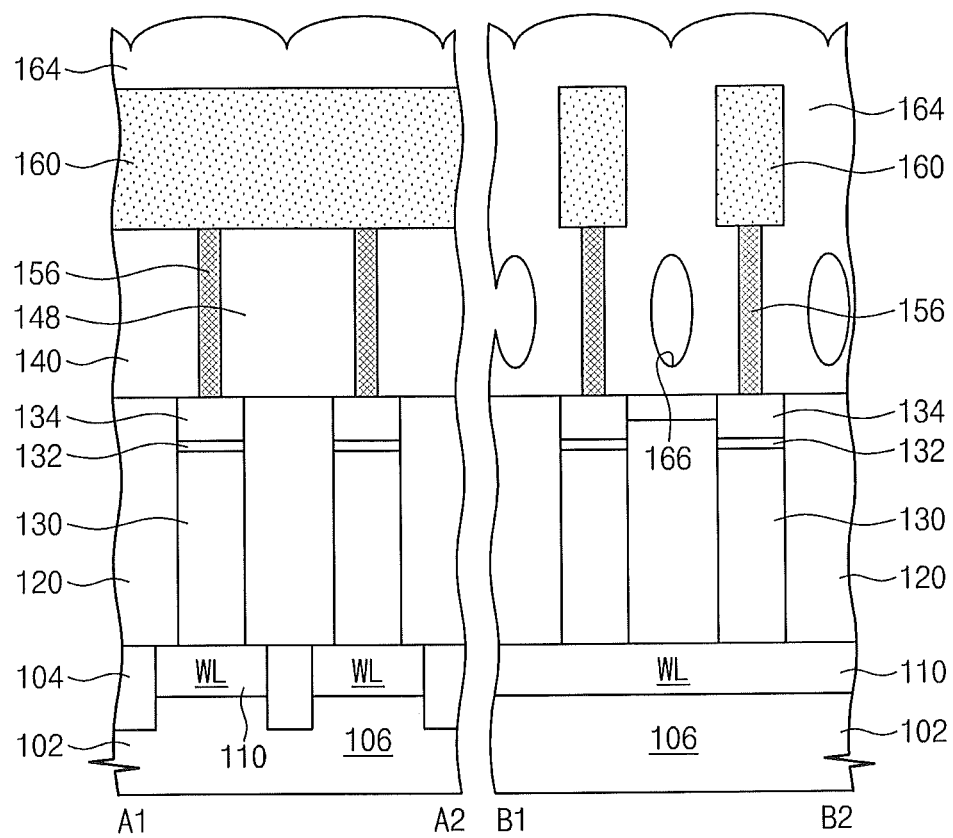

Referring to FIG. 4E, as the result of the deposition process of FIG. 4D, the second mold layer 164 may be formed to have the air gap 166 between the shrunk lower electrodes 156. According to such an embodiment, since the second mold layer 164 is formed to have a relatively good step coverage, the air gap 166 may be relatively small.

Figure 4F:
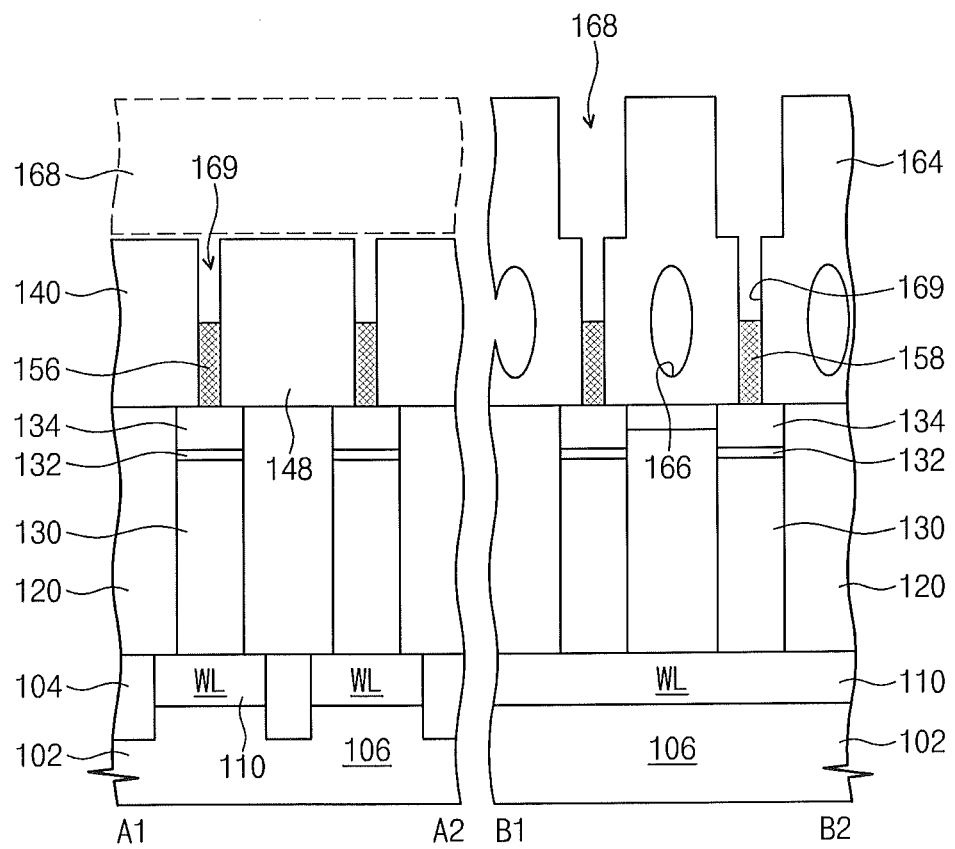

Referring to FIG. 4F, the second trenches 168 may be formed by planarizing the second mold layer 164 and removing the mask layer 160, and then, the upper portion of the shrunk lower electrode 156 may be partially removed to form the recessed lower electrode 158 and the plug hole 169. The second trenches 168 may be spaced apart from each other in the B direction, and each of them may have a hollow line structure extending along the A direction. The plug hole 169 may be placed below the second trench 168 and be aligned with the recessed lower electrode 158 in plan view.

Figure 4G:
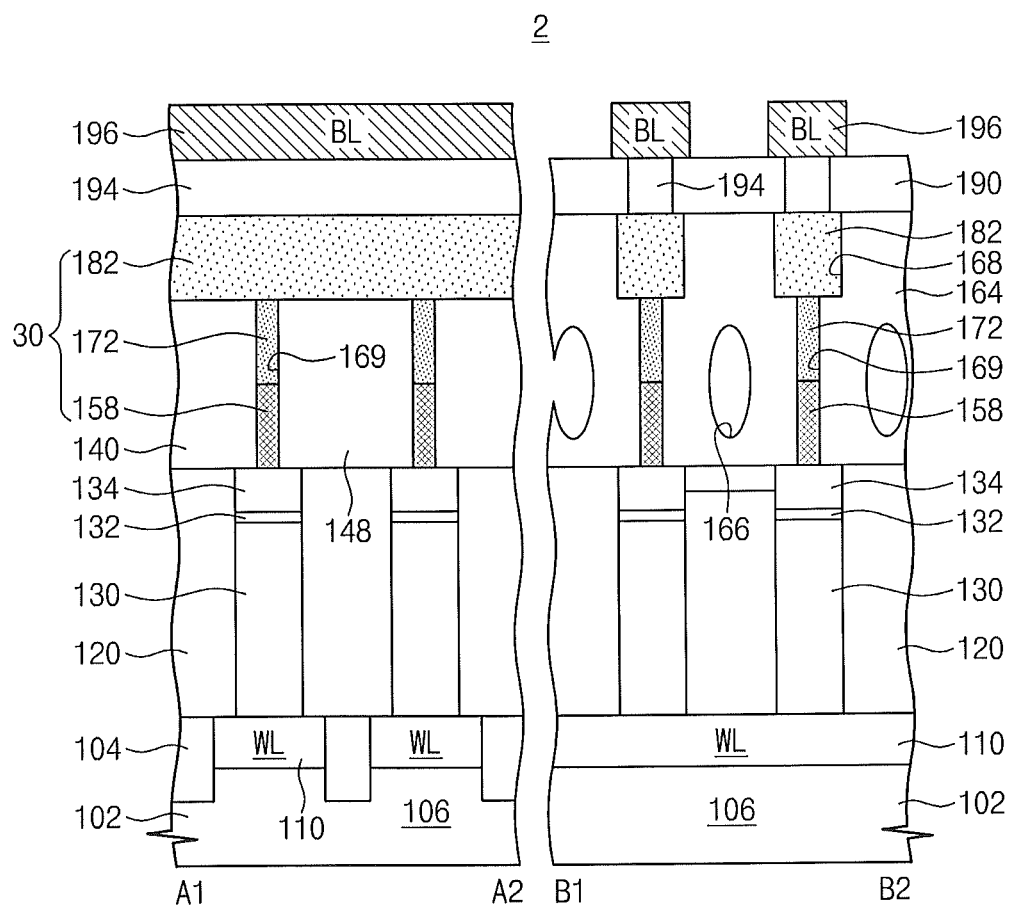

Referring to FIG. 4G, a phase-change layer may be deposited, planarized, and recessed to form the phase-change layer 172 filling the plug hole 169. The phase-change layer 172 may be self-aligned with the recessed lower electrode 158. An upper electrode layer may be deposited and planarized to form the upper electrode 182 filling the second trench 168. The upper electrode 182 may be self-aligned with the phase-change layer 172. In example embodiments, the recessed lower electrode 158, the phase-change layer 172, and the upper electrode 182 may be self-aligned to constitute a unit structure or the phase-change memory cell 30. Thereafter, the second interlayered insulating layer 190 may be formed on the resulting structure with the phase-change memory cell 30, the upper electrode contact 194 may be formed through the second interlayered insulating layer 190 and be connected to the upper electrode 182, and the bit line 196 may be connected to the upper electrode contact 194. A phase-change memory device 2 according to other example embodiments of the inventive concept may be fabricated, as the result of the series of the above processes.

Figure 5A:
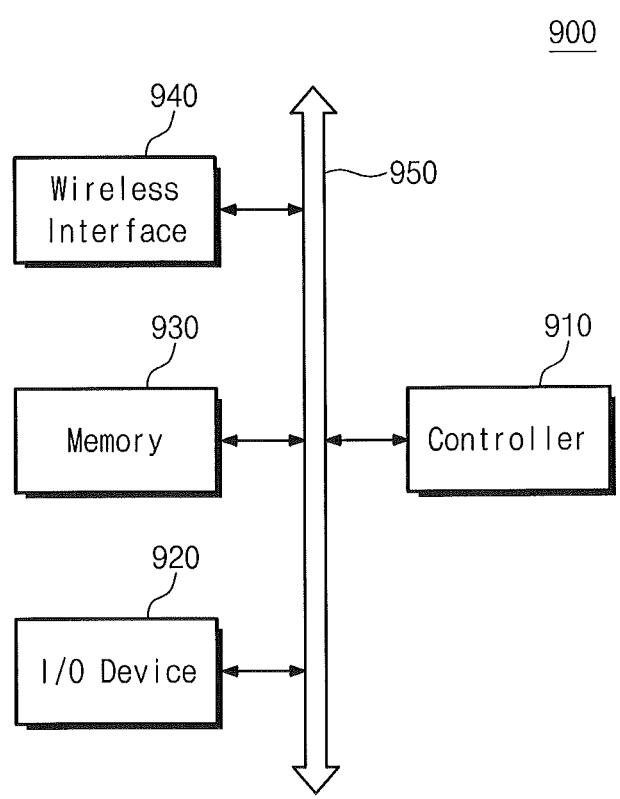
FIG. 5A is a schematic block diagram illustrating an electronic system including a phase-change memory device according to some embodiments of the inventive concept.

FIG. 5A is a schematic block diagram illustrating an electronic system including a phase-change memory device according to some embodiments of the inventive concept.

Referring to FIG. 5A, an electronic system 900 according to some embodiments of the inventive concept may be employed, for example, in a wireless communication device (e.g., PDA, a laptop computer, a portable computer, a web tablet, a wireless phone and a cell phone), a digital music player, or in electronic devices that can transmit and/or receive information in a wireless environment.

The electronic system 900 may include a controller 910, an input/output device 920 such as a keypad, keyboard and a display, a memory 930, and a wireless interface 940 that are combined with one another through a bus 950. The controller 910 may include, for example, at least one microprocessor, digital signal processor, microcontroller or the like. The memory 930 may be used for storing an instruction code executed by the controller 910 and/or used for storing user data. The memory 930 may include at least one of the phase-change memory devices 1 and 2 according to some embodiments of the inventive concept. The memory 930 may further include at least one other type memory devices, at least one random accessible volatile memory, or the like.

The electronic system 900 may use a wireless interface 940 to transfer data to a wireless communication network that communicates by RF signal or to receive data from the wireless communication network. For example, the wireless interface 940 may include an antenna, a wireless transceiver, and other wireless system elements.

The electronic system 900 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, MMDS, and so forth. In addition, the phase-change memory devices according to some embodiments of the inventive concept may be applied to realize a memory card, as will be described with reference to FIG. 5B.

Figure 5B:
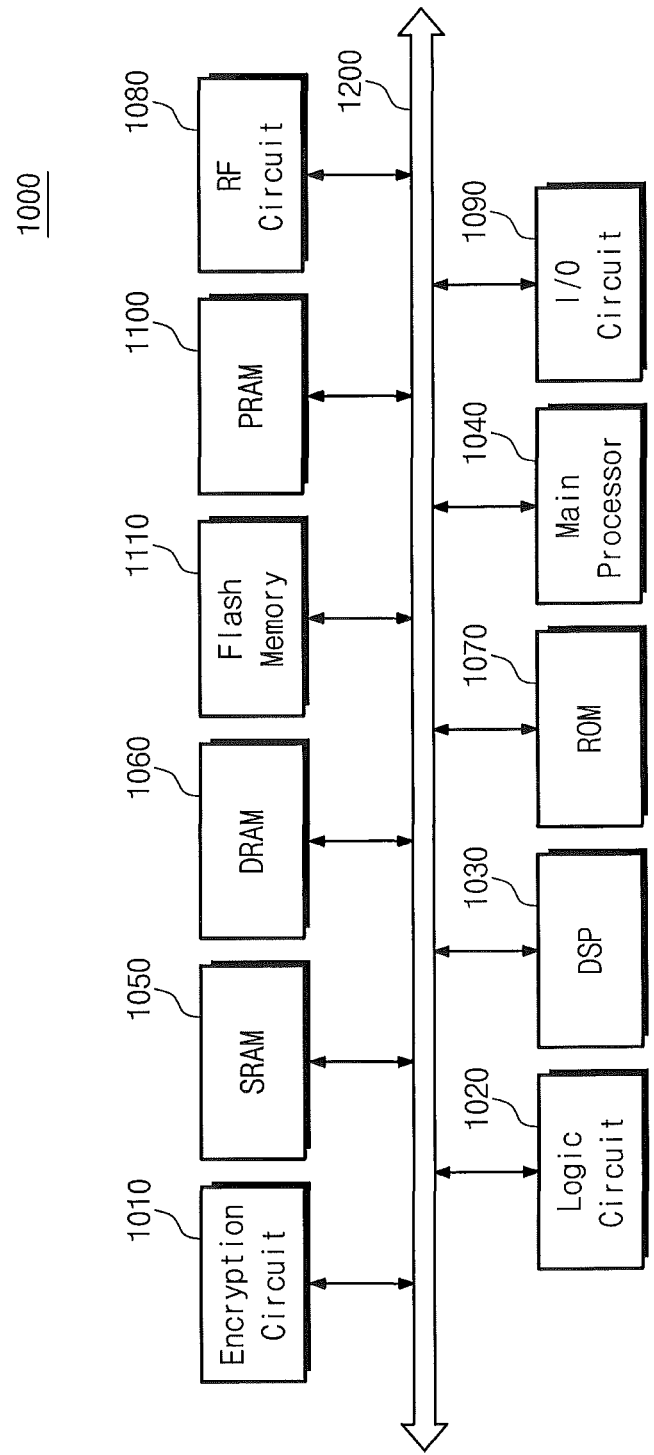
FIG. 5B is a schematic block diagram illustrating a memory card including a phase-change memory device according to other embodiments of the inventive concept.

FIG. 5B is a schematic block diagram illustrating a memory card including a phase-change memory device according to some embodiments of the inventive concept.

Referring to FIG. 5B, a memory card 1000 according to some embodiments of the inventive concept may include an encryption circuit 1010, a logic circuit 1020, a digital signal processor (DSP) 1030, and a main processor 1040. In addition, the memory card 1000 may include at least one memory device including a phase-change memory device 1100, which may be configured to have substantially the same features as one of the phase-change memory devices according to some embodiments of the inventive concept, and other type memory devices (e.g., SRAM 1050, DRAM 1060, ROM 1070, and FLASH memory 1110). In some embodiments, the memory card 1000 may further include an RF circuit 1080 and an I/O circuit 1090. Functional blocks 1010-1110 provided in the memory card 1000 may be connected to each other via a system bus 1200. The memory card 1000 may be operated in response to control signals from an extern host, and the phase-change memory device 1100 may store or output data in response to control signals from the host.

According to some embodiments of the inventive concept, a phase-change memory cell may be formed to have a confined structure and an air gap may be formed between phase-change layers. Accordingly, it is possible to reduce thermal interference between the phase-change layers and improve electric characteristics of the device. In addition, the lower electrode may be formed to have a dash shape and a reduced longitudinal axis, and this makes it possible to reduce a contact area between the lower electrode and the phase-change layer and thereby reduce a reset current. A space for the phase-change layer and the lower electrode can be formed without photo and/or etching processes. In other words, it is possible to simplify a fabrication process.

While some embodiments of the inventive concepts have been particularly shown and described, it will be understood by one of ordinary skill in the art that variations in form and detail may be made therein without departing from the spirit and scope of the attached claims.

What is claimed is:

1. A phase-change memory device comprising:
memory cells at intersections of word lines and bit lines, the memory cells extending along first and second directions crossing each other; and
a mold layer including gaps therein between the memory cells to separate the memory cells from each other, wherein each of the gaps comprises an air gap, a vacuum, a liquid, or a solid material within the mold layer, and
wherein each of the memory cells comprises:
a lower electrode electrically connected to the word line and having a first width in the first direction;
an upper electrode electrically connected to the bit line and having a second width in the first direction, the second width being greater than the first width; and
a phase-change layer between the lower electrode and the upper electrode and having the first width in the first direction.

2. The device of claim 1,
wherein the lower electrode is confined in the intersection,
wherein the phase-change layer is vertically aligned with the lower electrode and is confined in the intersection, and
wherein the upper electrode is vertically aligned with the phase-change layer and extends along the second direction.

3. The device of claim 1, wherein the gap is between the phase-change layers that are spaced apart from each other in the first direction.

4. The device of claim 3, wherein the gap extends between the lower electrodes that are spaced apart from each other in the first direction.

5. The device of claim 1, wherein a first space between the upper electrodes adjacent each other is narrower than at least one of a second space between the phase-change layers and a third space between the lower electrodes adjacent each other.

6. The device of claim 5, wherein the gap is in at least one of the second space and the third space.

7. The device of claim 1, wherein the memory cell further comprises a protection layer provided between the memory cell and the mold layer to cover both sidewalls of the memory cell and extend along the second direction.

8. The device of claim 1, further comprising a selection device provided between the memory cell and the word line, wherein the selection device comprises a diode provided within the intersection.

9. The device of claim 1, further comprising an upper electrode contact provided between the bit line and the upper electrode,
wherein the upper electrode contact extends along the second direction.

10. A phase-change memory device comprising:
memory cells at intersections of word lines extending in a first direction and bit lines extending in a second direction, wherein each of the memory cells comprises:
a lower electrode comprising a lower portion having a first width in the second direction and an upper portion having a second width in the second direction less than the first width, wherein the lower portion is electrically connected to the word line;

a phase-change layer, electrically connected to the bit line, that contacts the upper portion of the lower electrode at a first interface having the second width in the second direction;

an upper electrode electrically connected to the bit line and contacting the phase-change layer at a second interface having a third width in the second direction, the third width being less than the first width and greater than the second width; and a mold layer including thermal isolation regions between the memory cells along the first direction to thermally separate the memory cells from each other.

11. The device of claim 10, wherein the lower and upper portions of the lower electrode form an L shape.

12. The device of claim 11, further comprising a spacer adjacent to the upper portion of the lower electrode and between the lower portion of the lower electrode and the phase change layer.

13. The device of claim 10, wherein the lower electrode has a fourth width in the first direction, the phase-change layer has a fifth width in the first direction and the upper electrode has a sixth width in the first direction, and wherein the sixth width is greater than the fourth and fifth widths.

14. The device of claim 10, wherein the thermal isolation regions comprise respective gaps in the mold layer.

15. The device of claim 14, wherein each of the gaps comprises an air gap, a vacuum, a liquid, or a solid material within the mold layer.

16. The device of claim 10, wherein the lower electrode comprises an asymmetrical shape comprising the first and second widths.

17. A phase-change memory device comprising:

first and second phase-change memory cells comprising first and second phase-change layers, respectively, that are spaced apart from each other;

a void between the first and second phase-change layers;

first and second lower electrodes contacting lower surfaces of the first and second phase-change layers, respectively; and first and second upper electrodes on upper surfaces of the first and second phase-change layers, respectively, wherein the first lower electrode comprises an asymmetrical shape comprising a first width that contacts the lower surface of the first phase-change layer and a second width that is wider than the first width, and wherein the second lower electrode comprises an asymmetrical shape comprising a third width that contacts the lower surface of the second phase-change layer and a fourth width that is wider than the third width.

* * * * *